United States Patent
Kang et al.

(10) Patent No.: US 6,209,194 B1
(45) Date of Patent: Apr. 3, 2001

(54) APPARATUS FOR LOADING AND UNLOADING SEMICONDUCTOR DEVICE PACKAGES USING SERVO MOTORS

(75) Inventors: Ju Il Kang; Byung Ro Kim; Sung Yeol Lee; Hyun Ho Kim; Young Ki Park, all of Chungcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 08/943,231

(22) Filed: Oct. 3, 1997

(30) Foreign Application Priority Data

Oct. 5, 1996 (KR) .................................................. 96-44173
Jun. 20, 1997 (KR) .................................................. 97-26125

(51) Int. Cl.[7] .................................................. B23P 19/00
(52) U.S. Cl. ........................ 29/739; 29/740; 29/836; 198/448; 198/438
(58) Field of Search .............................. 29/705, 707, 710, 29/711, 712, 739, 740; 198/436, 448; 414/403, 413

(56) References Cited

U.S. PATENT DOCUMENTS

| | | | |
|---|---|---|---|
| 3,301,380 | * | 1/1967 | Schickle ................... 198/401 |
| 3,373,664 | * | 3/1968 | Brockmuller ................ 493/218 |
| 3,583,545 | * | 6/1971 | Hovenkamp ............... 414/795.6 |
| 3,917,049 | * | 11/1975 | Shirai et al. .................. 198/32 |
| 4,249,062 | * | 2/1981 | Hozumi et al. ............... 219/124.34 |
| 4,509,638 | * | 4/1985 | Kato et al. ................... 198/486 |
| 4,570,414 | * | 2/1986 | Focke et al. .................. 53/373 |
| 4,584,764 | * | 4/1986 | Gussman ...................... 29/705 |
| 4,684,008 | * | 8/1987 | Hayashi et al. ............... 198/436 |
| 4,781,517 | * | 11/1988 | Pearce et al. ................. 414/590 |
| 4,906,162 | * | 3/1990 | Long et al. ................... 414/786 |
| 5,040,291 | * | 8/1991 | Janisiewcz et al. ............ 29/840 |
| 5,310,039 | * | 5/1994 | Butera et al. ................. 198/346.2 |
| 5,452,509 | * | 9/1995 | Suzuki et al. ................ 29/740 |
| 5,503,263 | * | 4/1996 | Watanabe ..................... 198/442 |
| 5,533,607 | * | 7/1996 | Hulse et al. .................. 198/448 |
| 5,842,272 | * | 12/1998 | Nuxoll ........................ 29/739 |

* cited by examiner

Primary Examiner—Lee Young
Assistant Examiner—Sean Smith
(74) Attorney, Agent, or Firm—Jones Volentine, LLC

(57) ABSTRACT

An automatic loading and unloading apparatus using servo motors allows simultaneous loading and unloading of two or more semiconductor device packages into and from test devices. The loading and unloading apparatus has a feeding mechanism which has a feed container carrying two semiconductor device packages which have not yet been tested; a loading tool for transferring those two semiconductor device packages from the feed container to a centering position; a DC test contact tool; an insertion tool; a removal tool; and a sorting station for sorting the semiconductor device packages depending on results of a burn-in test. The tools of the apparatus are driven by the action of servo motors, thereby allowing independent movements thereof in the vertical and horizontal directions.

22 Claims, 17 Drawing Sheets

FIG.11c
FIG.11d
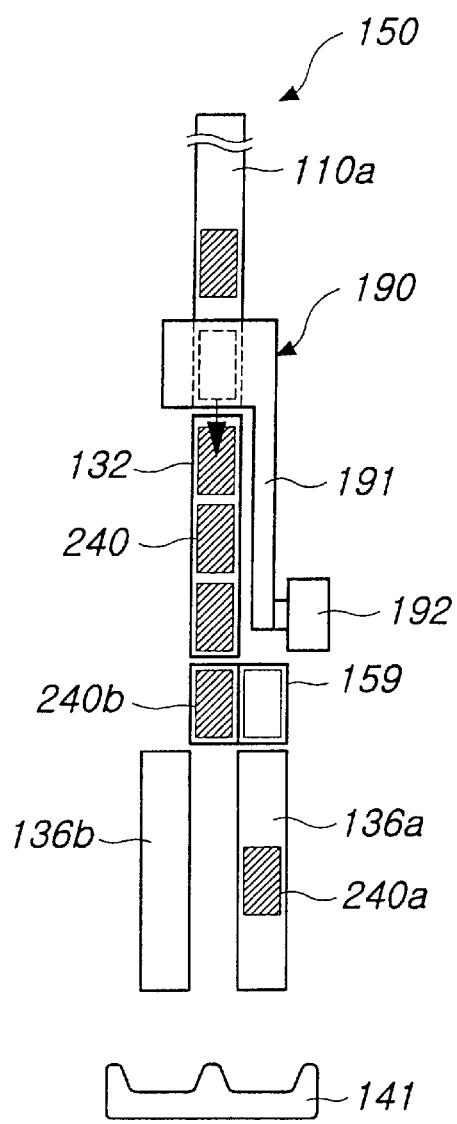
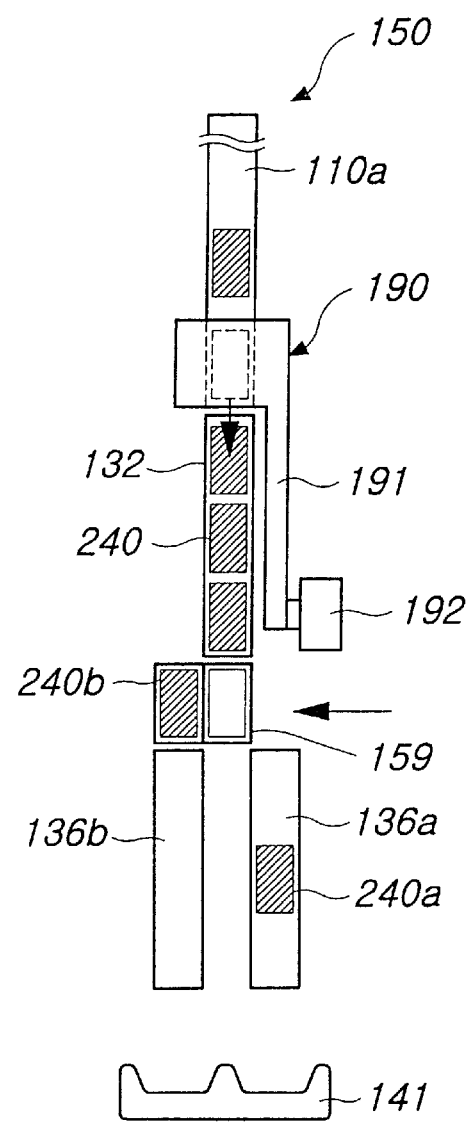

FIG.11e
FIG.12a
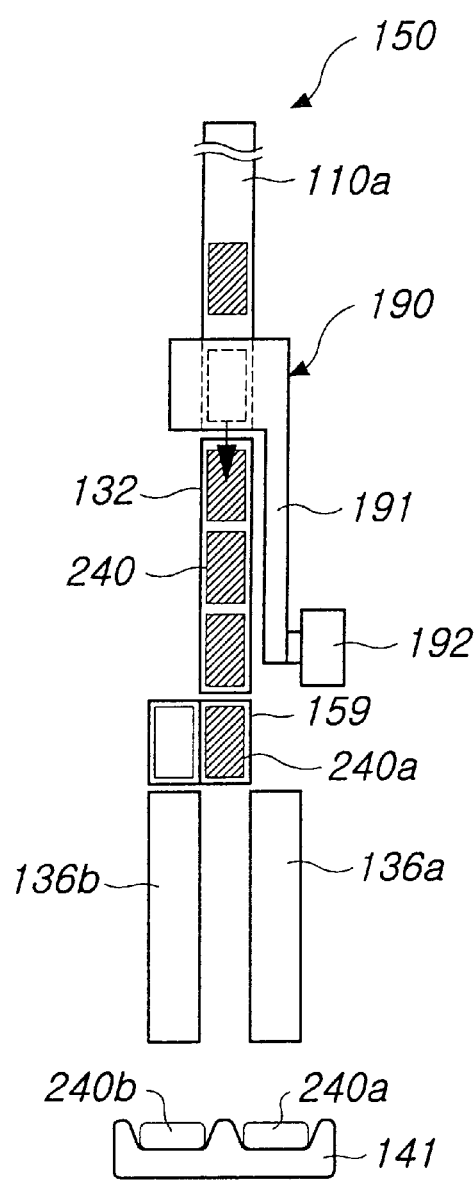
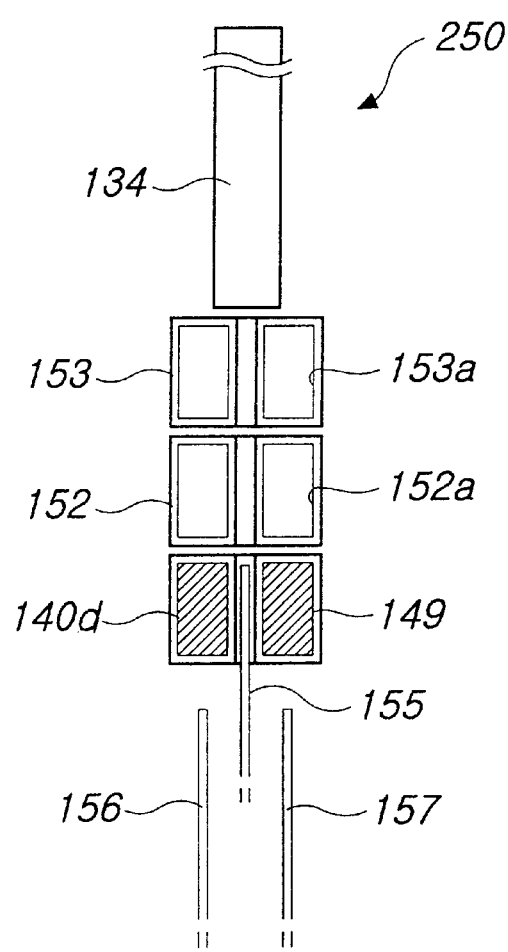

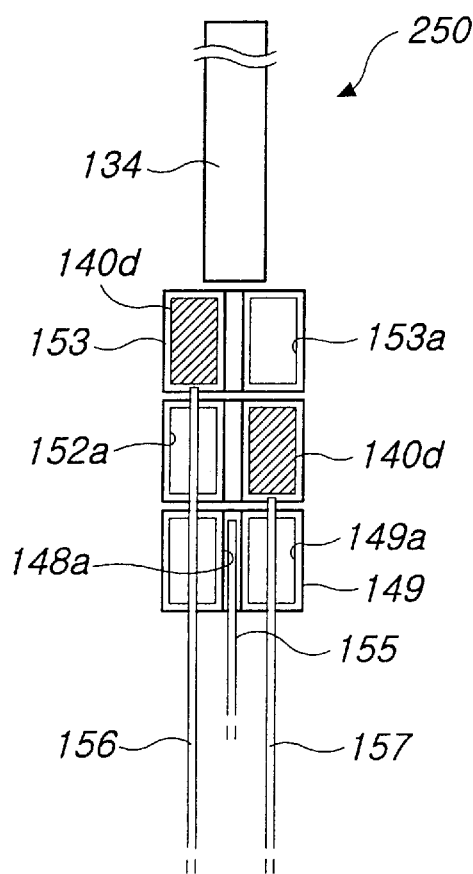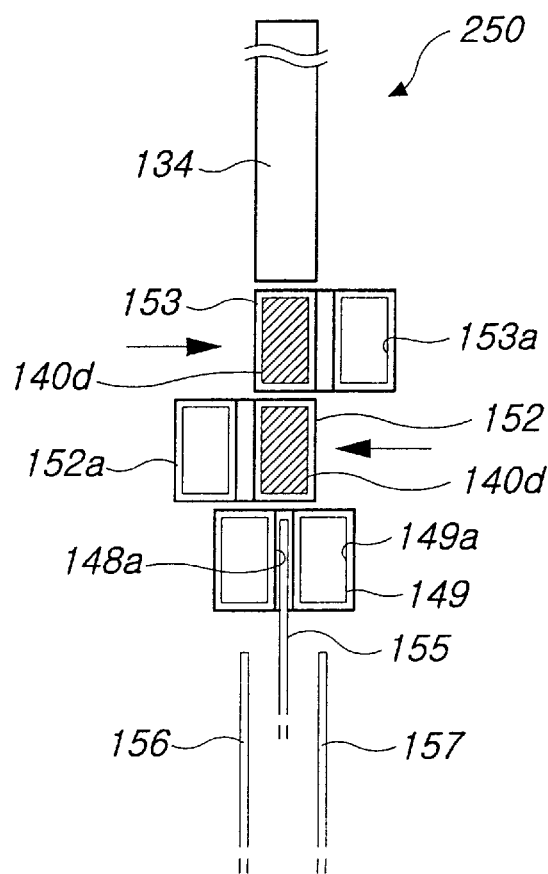

FIG.12d
FIG.12e
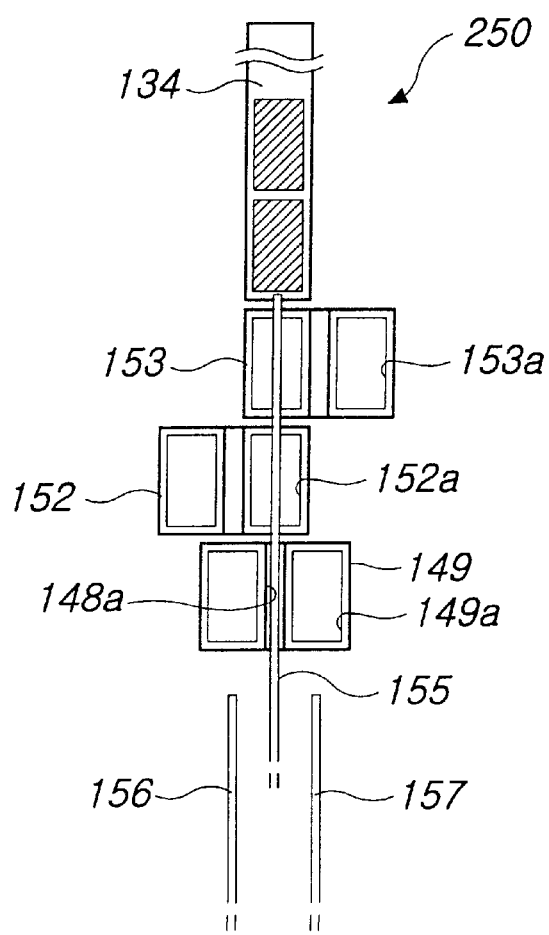
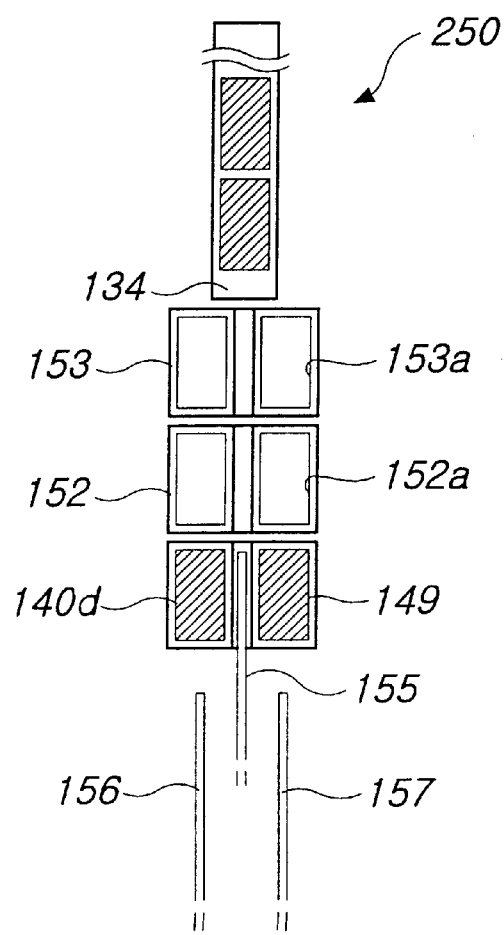

APPARATUS FOR LOADING AND UNLOADING SEMICONDUCTOR DEVICE PACKAGES USING SERVO MOTORS

BACKGROUND OF THE INVENTION

1. Field of the Invention

The present invention relates generally to an apparatus for loading and unloading semiconductor device packages. More particularly, it relates to an apparatus for loading and unloading semiconductor device packages using servo motors, which apparatus loads the packages into a burn-in board where burn-in tests of the packages are performed, and unloads the tested packages from the burn-in board.

2. Description of the Related Arts

In general, a semiconductor device package is subjected to various reliability tests. The tests include an electrical characteristics test and a burn-in test; the former is performed to check the normal operations and possible failures by connecting all the input/output terminals of the package to a test signal generating circuit, and the latter is performed to check the lifetime and possible defects of the chip in the package by connecting power source terminals and some input/output terminals of the package to a test signal generating circuit and applying an elevated temperature, current and voltage to stress the package.

After completing the assembly process the semiconductor device package is usually loaded into a burn-in socket of a burn-in board and then fed into a burn-in apparatus where the burn-in test is carried out. After the test is performed, the tested package is unloaded from the burn-in socket and sorted depending on the test results. For loading and unloading the package, a loading and unloading apparatus having a plurality of driving tools is usually employed.

The conventional loading and unloading apparatus has a loading tool, a DC test contact tool, an insertion tool, a removal tool, and an extension tool. Each tool is linked to a cam to render its movements in a vertical or horizontal direction.

FIG. 1 is a schematic view of a conventional apparatus for loading and unloading a semiconductor device package from a tube-type container. FIG. 2 is a flow chart showing the steps of loading and unloading the semiconductor device package using the apparatus shown in FIG. 1.

With reference to FIG. 1, the conventional loading and unloading apparatus 100, which is employed for loading and unloading a semiconductor device package into and from a tube-type container ('tube'), consists of three stations: a transferring station, a loading and unloading station, and a sorting station. In the transferring station, a first semiconductor device package 40a (which has not yet been tested in the DC (Direct Current) test and is hereinafter referred to as simply 'first semiconductor device package' or 'first package') is transferred to DC test position 45 where the DC test is performed. In the loading and unloading station, the package 40a that completed the DC test is loaded into a burn-in board 47 on an XY table 42, and at the same time a second semiconductor device package 40b, (which has completed its burn-in test and is hereinafter referred to as simply 'second semiconductor device package' or 'second package'), is unloaded from burn-in board 47 and transferred to receiving position 49. In the sorting station, the second package 40b in receiving position 49 is sorted depending on the test results; those second packages deemed to be good are numbered 40d and those deemed to be defective are numbered 40c.

In more detail, the transferring station comprises a ready position 41 which receives a first semiconductor device package 40a before the DC test. The package free falls from a feed tube 10a onto a transfer rail 32 along which the package moves. The transferring station further comprises a loading tool 21 for transferring the package 40a from the ready position 41 to the centering position 43, and a DC test contact tool 23 for transferring the package 40a from the centering position 43 to a DC test position 45. The loading tool 21 also serves to align the first package 40a with the DC test socket provided at DC test position 45 before transferring the package 40a to centering position 43.

The loading and unloading station, which is located between DC test position 45 and receiving position 49, comprises XY table 42 provided with burn-in board 47 having a burn-in socket, said socket being loaded with a second semiconductor device package 40b to be tested. After the burn-in test, removal tool 27 transfers the second package 40b from the burn-in socket to receiving position 49. Insertion tool 25 loads the first package 40a, which has completed its DC test, from DC test position 45 into the burn-in socket. The insertion tool 25 and removal tool 27 move in the same direction. Thus, when insertion tool 25 picks up first package 40a from DC test position 45, removal tool 27 also picks up second package 40b from burn-in board 47 at the same time. Moreover, insertion tool 25 carrying first package 40a moves toward burn-in board 47, while removal tool 27 carrying second package 40b moves toward receiving position 49 in the same direction. Insertion tool 25 loads first package 40a into the burn-in socket in burn-in board 47, while at the same time removal tool 27 loads second package 40b into receiving position 49. In FIG. 1 and FIG. 3, all the packages 40a, 40b, 40c and 40d are presumed to be moved from the left to the right.

The sorting station has a pusher (not shown) for pushing second package 40b along transfer rail 34 into receiving tube 10b if the package is classified as a good one depending on the burn-in test results. The sorting station also has sorting position 50 which comprises extension tool 29 for transferring second package 40b from receiving position 49 to turntable 51, if the transferred package 40c is considered to be defective. Sorting robot 53 classifies the package 40c depending on the kind and degree of defect.

DC test contact tool 23, insertion tool 25 and removal tool 27 operate together, while loading tool 21 and extension tool 29 work independently depending on the positions of ready position 41 and of turntable 51. Nevertheless, the vertical movements of loading tool 21 and of extension tool 29 are uniformly driven by a cam (not shown).

The steps of loading a first semiconductor device package to a burn-in board using the apparatus 100 described in above, and the steps of sorting a second semiconductor device package after a burn-in test will be described with reference to FIGS. 1 and 2. In preparation step 1 a tube-type container 10a having first semiconductor device packages 40a (before DC test) is provided, and burn-in board 47 having a burn-in socket loaded with second semiconductor device package 40b (after burn-in test) is provided on XY table 42. In transfer step 2, first package 40a is transferred to ready position 41 by freely falling, due to gravity, on a transfer rail 32. In centering step 3, first package 40a is centered, and in DC test step 4, the electrical properties of first package 40a are tested.

If the first package fails the DC test, it is then fed to collection step 5. On the other hand, in loading and unloading step 6, if the first package passes the DC test, it is loaded into the burn-in socket, while at the same time the second package 40b that has already been burn-in tested is unloaded from the burn-in socket. The first package 40a which failed its DC test is immediately returned to preparation step 1 for retesting.

The second package 40b which is unloaded from the burn-in socket in loading and unloading step 6 is transferred to receiving position 49. The second package 40b is moved to receiving step 9 if it is considered good based on the test results, while it is moved to sorting step 8 if considered defective.

The time for one cycle from the loading of a first package into the burn-in socket to the unloading of a second package from the burn-in socket is about 1.5 seconds. However, if any defective first package is found after the DC test is performed, the steps of preparation, transferring, centering and DC test must be repeated, consequently resulting in a decrease in the yield.

FIG. 3 is a schematic view of a conventional apparatus for loading and unloading a semiconductor device package from a tray-type container ('tray'). FIG. 4 is a flow chart showing the steps of loading and unloading the semiconductor device package using the apparatus shown in FIG. 3.

With reference to FIG. 3, loading and unloading apparatus 200, which is employed for loading and unloading a semiconductor device package into and from a tray, consists of three stations: a transferring station, a loading and unloading station, and a sorting station. In the transferring station, the first semiconductor device package 40a is transferred to DC test position 45 where DC testing of the package is performed. In the loading and unloading station, the first package 40a that completed the DC test is loaded into a burn-in board 47 on an XY table 42, and at the same time a second semiconductor device package 40b that has already been burn-in tested is unloaded from the burn-in board 47 and transferred to receiving position 49. In the sorting station, the second package 40b in the receiving position 49 is sorted depending on the burn-in test results.

Unlike loading and unloading apparatus 100 in FIG. 1, the transferring part of the loading and unloading apparatus 200 suitable for the tray does not comprise a ready position 41 since loading tool 21 for the apparatus 200 directly moves first package 40a from feed tray 35 to centering position 43. The feed tray 35 is provided near centering position 43 by using a separate tray transfer apparatus 36, while the receiving tray 37, which receives the good second package 40d, is provided near receiving position 49 by using separate tray transfer apparatus 38.

Extension tool 29, like the extension tool of the apparatus 100 in FIG. 1, transfers second package 40c, which is considered defective based on the burn-in test results, to turntable 51 as well as loads second package 40d, which is considered good, into receiving tray 37.

The steps of loading a first package into the burn-in board by using the apparatus 200 described above, and the steps of sorting a second package after burn-in test will be described with reference to FIGS. 3 and 4. In a preparation step 1 a feed tray 35 having first semiconductor device packages 40a is provided, and burn-in board 47 having a burn-in socket loaded with second semiconductor device package 40b after the burn-in test is provided on XY table 42. In centering step 2, loading tool 21 moves first package 40a from feed tray 35 to centering position 43.

The subsequent DC test step 4, collection step 5, loading and unloading step 6 and sorting step 8 are carried out in the same manner as those in FIG. 2, except for receiving step 9 where the second package 40b, if it is considered good, is transferred to receiving tray 37 by extension tool 29. The time for one cycle from the loading of a first package into the burn-in socket to the unloading of a second package from the burn-in socket is about 1.8 seconds.

The structure of cams 73, 74, 75, 76, 77 and 78 of the loading and unloading apparatus 100, 200 will be described hereinafter.

FIG. 5 is a schematic side view of a cam for driving tools of the apparatuses in FIG. 1 and FIG. 3; FIG. 6 is a front view of a cam for moving the tools of the apparatuses in FIG. 1 and FIG. 3 in a vertical direction; and FIG. 7 is a front view of a cam for moving the tools of the apparatuses in FIG. 1 and FIG. 3 in a horizontal direction.

With reference to FIG. 5, a plurality of cams, i.e. first 73, second 74, third 75, fourth 76, fifth 77 and sixth cams 78 are fastened to one shaft 71. The individual cams are spaced from each other. Each cam has a respective corresponding link 52a, 52b, 52c, 52d, 52e or 52f. Each link has a bearing 56, which is in contact with the outer surface of the cam. Therefore, cams 73, 74, 75, 76, 77 and 78 rotate in the same direction as the rotation of shaft 71, while links 52a–f move reciprocally in the vertical direction.

Third 75, fourth 76 and fifth cams 77 drive DC test contact tool 23, insertion tool 25 and removal tool 27, respectively, in the vertical direction.

Second cam 74 is coupled to the loading tool 21, and sixth cam 78 is coupled to the extension tool 29. First cam 73 simultaneously moves DC test contact tool 23, insertion tool 25 and removal tool 27 in the horizontal direction. The structure of the coupling of removal tool 27 to fifth cam 77 and the structure of first cam 73 are schematically shown in FIG. 5.

With reference to FIGS. 5 and 6, removal tool 27 is moved vertically by the action of fifth cam 77. In more detail, removal tool 27 moves vertically by the motion of fifth cam 77 as well as by the action of air cylinder 50e mechanically coupled to fifth cam 77.

Fifth cam 77 and air cylinder 50e are coupled to removal tool 27 so that one end of air cylinder 50e is fixed to the body of loading and unloading apparatus 200. Thus, cylinder shaft 53e is inserted and fitted into cylinder fixing part 5 le of air cylinder 50e so as to be fixed to the body of loading and unloading apparatus 200. Cylinder rod 57e extending from the other end of air cylinder 50e is coupled to one end of fifth link 52e by means of fixing projection 59e.

Use of the term "fitted" indicates that one member is fitted into the other member in such a way that the two members are fastened together, while one member can still freely rotate or move relative to the other member.

Fifth link 52e may have a T-shape, and is coupled to air cylinder 50e and fifth cam 77 at its horizontal ends. Thus, air cylinder 50e is coupled substantially perpendicular to one horizontal end of fifth link 52e by means of fixing protrusion 59e. The outer surface of fifth cam 77 is in contact with bearing 56e provided at the other horizontal end of fifth link 50e. The remaining end of fifth link 52e is coupled to one end of fifth link rod 61e by means of fixing protrusion 58e. Hinge shaft 54e is inserted into the center hole of fifth link 52e so that fifth link 52e can rotate about hinge shaft 54e. Fifth cam 77 is fit onto cam shaft 71.

The other end of fifth link rod 61e is coupled to one end of fifth rotation link aria 60e. Fifth rotation link 60e may have an L-shape, and its one end is coupled to one end of fifth link rod 61e while its other end is coupled to transfer guide 82 of removal tool 27 by fixing means 85. Hinge shaft 63e is provided in a corner of fifth rotation link 60e such that fifth rotation link 60e can rotate about shaft 63e.

Removal tool 27 is equipped with transfer guide 82 coupled to one end of fifth rotation link 60e by means of fixing means 85; tool head 86 spaced from transfer guide 82; transfer rod 83 fitted between and into transfer guide 82 and tool head 86; transfer rod guides 84 placed at opposite sides of transfer rod 83 and fitted between transfer guide 82 and tool head 86; and rotation means 81 such as a rotary actuator coupled to one end of transfer rod 83 at an upper position of transfer guide 82. Suction means 87 for picking up a semiconductor device package is provided at the other end of transfer rod 83, the other end extending downward toward tool head 86. Fixing means 85, which may have a ball shape, can freely rotate in and move along trench groove 89 in transfer guide 82. Rotation means 81 is provided at transfer rod 83 in order to facilitate the positioning of a semiconductor device package picked up by suction means 87 by using rotation means 81.

Removal tool 27 is moved in the vertical direction responsive to movement of fifth cam 77 as follows: when fifth cam 77 rotates by the rotation of cam shaft 71, fifth link rod 61e coupled to fifth link 52e moves leftward and fifth rotation link 60e coupled to fifth link rod 61e rotates counterclockwise about hinge shaft 63e, so that transfer guide 82 coupled to fifth rotation link 60e and removal tool 27 move upward. The maximum height which removal tool 27 can reach is the distance from the center of cam shaft 71 to the point where bearing 56e is in contact with the outer surface of fifth cam 77. At this time, fixing ball 85, which couples fifth rotation link 60e to transfer guide 82, moves in the horizontal direction along trench groove 89. Then, once removal tool 27 reaches the maximum height, it goes down by the reverse movement used for going up. At this time, fixing ball 85 moves rightward along trench groove 89. The downward movement of bearing 56e of fifth link 52e is accomplished by the motion of fifth cam 77. By contrast, the lifting of bearing 56e of fifth link 52e, which is at its lowest position, requires the motion of air cylinder 50e. Thus, bearing 56e of fifth link goes up while staying in contact with fifth cam 77 by the downward motion of cylinder rod 57e of air cylinder 50e.

Thus, the upward motion of removal tool 27 is accomplished by the motion of fifth cam 77, while downward motion of remove remove tool 27 is accomplished by the motion of air cylinder 50e.

With reference to FIGS. 5 and 7, the structure in which DC test contact tool 23, insertion tool 25 and removal tool 27 are coupled to first cam 73 will be described. One end of air cylinder 50a for rotating first link 52a counter-clockwise is fastened to the body of the loading and unloading apparatus. In more detail, cylinder shaft 53a is inserted into fixing part 51a of air cylinder 50a so that air cylinder 50a can be coupled to the loading and unloading apparatus. Cylinder rod 57a extending from the other end of air cylinder 50a is coupled to one end of first link 52a by means of fixing protrusion 59a.

Hinge shaft 54a is inserted and fitted into a center hole of first link 52a, and one end of first link 52a is coupled to one end of first link rod 61a by means of fixing protrusion 58a. Bearing 56a is coupled between hinge shaft 54a of first link 52a and fixing protrusion 58a coupled to first link rod 61a, and located so as to be in contact with an outer surface of first cam 73.

The other end of first link rod 61 a is coupled to one end of first rotation link 60a by means of fixing protrusion 62a.

First rotation link 60a may have an L-shape as does fifth rotation link 60e. One end of first rotation link 60a is coupled to one end of first link rod 61a, and the other end thereof is coupled to one end of coupling rod 65a by means of fixing protrusion 64a. Hinge shaft 63a is provided in the corner of first rotation link 60a such that first rotation link 60a can rotate about shaft 63a.

The other end of coupling rod 65a is mechanically coupled to transfer means 93, into which DC test contact tool 23, insertion tool 25 and removal tool 27 are inserted and fitted. In more detail, the other end of coupling rod 65a is coupled to fixing means 91 of transfer means 93, and fixing means 91 is attached to sliding member 92 of transfer means 93. Fixing means 91 may have a ball shape. Sliding member 92 is located under transfer means 93, and engaged into sliding groove 94 in two opposing transfer rails 90 so that sliding member 92 can freely slide in the rails 90.

Transfer rod 83 and transfer rod guides 84 of removal tool 27, insertion tool 25, and DC test contact tool 23 are engaged to transfer means 93.

DC test contact tool 23, insertion tool 25 and removal tool 27 move in the horizontal direction depending on the movement of first cam 73 as follows: bearing 56a is positioned so that the distance between bearing 56a in contact with the outer surface of first cam 73 and cam shaft 71 is shortest. When cam shaft 71 rotates, the distance between the center of cam shaft 71 and bearing 56a of first link 52a increases, and first link 52a rotates clockwise about hinge shaft 54a. At this time, the portion of first link 52a to the right of hinge shaft 54a moves downward, and first link rod 61a coupled to first link 52a moves downward as well.

First rotation link 60a coupled to first link rod 61a rotates clockwise and transfer means 93 coupled to first rotation link 60a via connection rod 65a moves leftward, so that DC test contact tool 23, insertion tool 25 and removal tool 27, all of which are coupled to transfer means 93, can move leftward.

Then, once transfer means 93 reaches the maximum point of leftward movement, in other words, it reaches the point where the distance between the center of cam shaft 71 and bearing 56a of first link 52a is maximum, transfer means 93 moves rightward to its original position by reverse movement. At this time, the downward movement of bearing 56a of first link 52a is accomplished by the motion of first cam 73. By contrast, the lifting of bearing 56a of first link 52a, which is at its lowest position, requires the motion of air cylinder 50a. Thus, first link 52a rotates counterclockwise about hinge shaft 54a of first link 52a due to the downward motion of cylinder 57a, and the end of first link 52a coupled to first link rod 61a moves up.

Thus, the leftward motion of transfer means 93 is accomplished by the motion of first cam 73, while the rightward motion of transfer means 93 is accomplished by the motion of air cylinder 50a. Of course, the vertical movements of DC test contact tool 23, insertion tool 25 and removal tool 27 are associated with the motions of third 75, fourth 76 and fifth cams 77.

For the loading and unloading apparatus described above, one cycle of cam shaft operation allows the loading or unloading of one semiconductor device package into or from the DC test position or burn-in socket. Thus, simultaneous operations of the DC test contact tool, insertion tool and removal tool as driven by cam 73 are required. The loading tool and the extension tool are not controlled by cam 73. However, their vertical movements are still governed by cam 74 and 78, respectively. Accordingly, the independent movement of each tool is not possible.

Without independent motion of each tool the DC test contact tool has only one opportunity to properly insert the first semiconductor device package into the DC test socket, and if proper insertion is not achieved on the first try, then the first semiconductor device package may be deemed defective and collected for refeeding into a new tube or tray for retesting. However, if independent vertical movement of the DC test tool is allowed, the DC test tool could have a second chance to properly insert the first semiconductor package into the DC test socket, resulting in a time savings by avoiding unnecessary retesting.

Moreover, the cycle time for a cam-driven type apparatus such as the apparatus described above has a finite limit which cannot be further reduced without the addition of at least one cam.

Further, the cycle time of the cam-driven apparatus is long and is governed by the movement of the mechanical elements (i.e., the cams and linkages); independent or reverse movement is not possible; and two or more packages cannot be handled at once.

SUMMARY OF THE INVENTION

The present invention provides an automatic loading and unloading apparatus using servo motors which allows independent vertical movements of individual tools therein.

The present invention also provides an automatic loading and unloading apparatus using servo motors, which allows for loading and unloading of two or more semiconductor device packages into and from test devices at once.

The present invention also provides a feeding means for feeding two or more semiconductor device packages from a tube-type container carrying the packages to the test devices.

The present invention further provides a receiving means for receiving two or more semiconductor device packages into a tube-type container after all testing has been completed.

The loading and unloading apparatus according to the present invention is used for loading first semiconductor device packages into a burn-in board of a test device and unloading second semiconductor device packages from the burn-in board.

The loading and unloading apparatus according to the present invention comprises: a feeding means for providing a feed container carrying first semiconductor device packages; a loading tool for transferring two first semiconductor device packages from the feed container to a centering position; a DC test contact tool for transferring said first semiconductor device packages from the centering position to a DC test position; an insertion tool for inserting said first semiconductor device packages after the DC test into a burn-in socket in a burn-in board; a removal tool for unloading from the burn-in socket and transferring to a receiving position second semiconductor device packages after the burn-in test; and a sorting station for sorting the second semiconductor device package depending on results of the burn-in test.

According to the present invention, the tools of the apparatus comprise: a revolving tool provided with a servo motor having a rod screw; a transfer rod coupled to the rod screw via a connection rod; and a tool head for picking up the semiconductor device packages, in which the loading and unloading of the packages is accomplished by the vertical movements of the transfer rod by action of the servo motors.

BRIEF DESCRIPTION OF THE ATTACHED DRAWINGS

These and various other features and advantages of the present invention will be described with reference to the accompanying drawings. In the drawings, all dimensions are in mm unless otherwise indicated and like reference numerals designate like structural elements, where:

FIG. 11a through FIG. 11e are plan views depicting in series the inventive apparatus for feeding two semiconductor device packages from the tube-type container to a ready station;

FIG. 12a through FIG. 12e are plan views depicting in series the inventive apparatus for removing the tested packages from a receiving position to an ejection rail;

DETAILED DESCRIPTION OF PREFERRED EMBODIMENT

Figure 1:
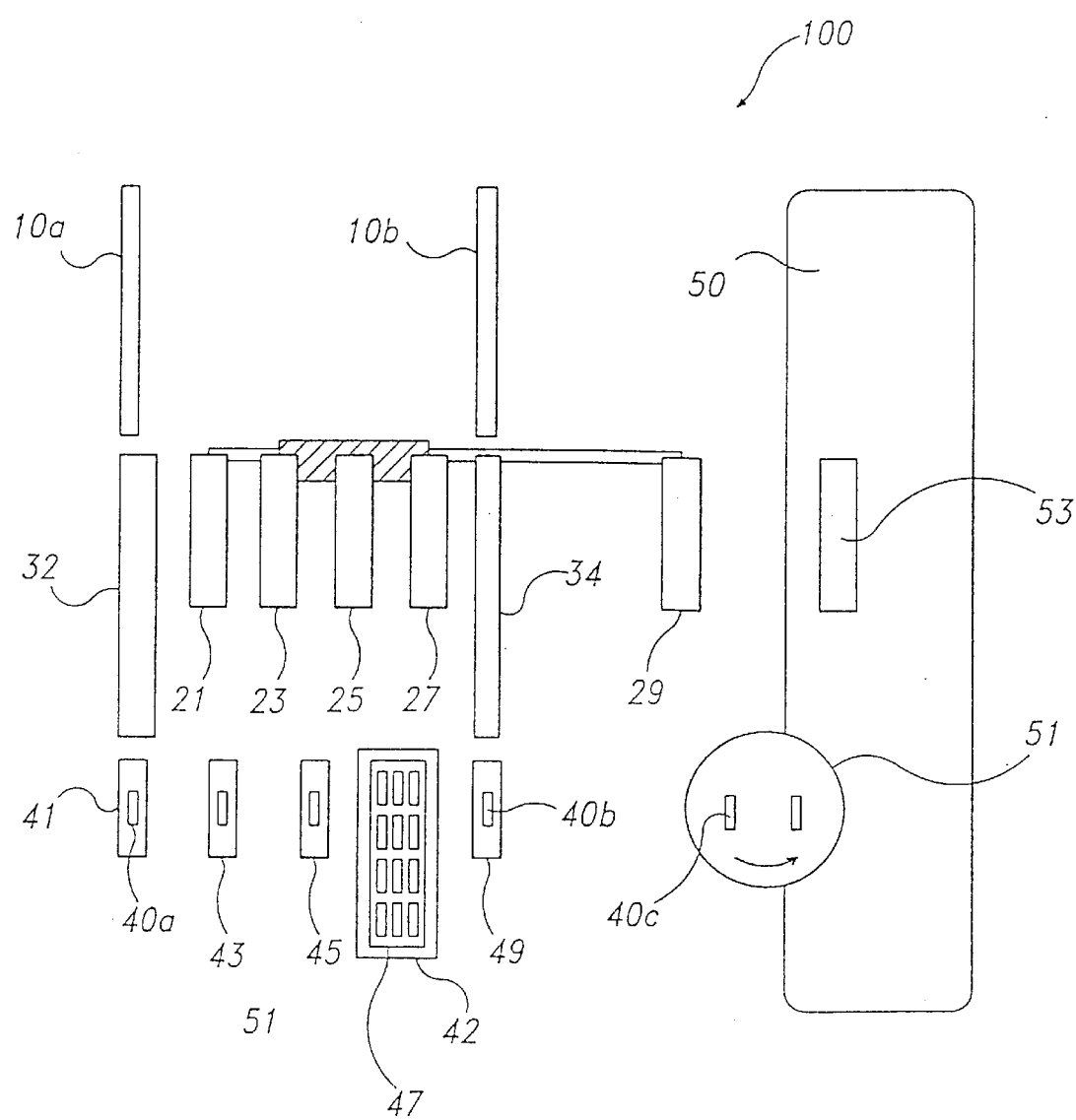
FIG. 1 is a schematic view of a conventional apparatus for loading and unloading a semiconductor device package from a tube-type container.
Figure 2:
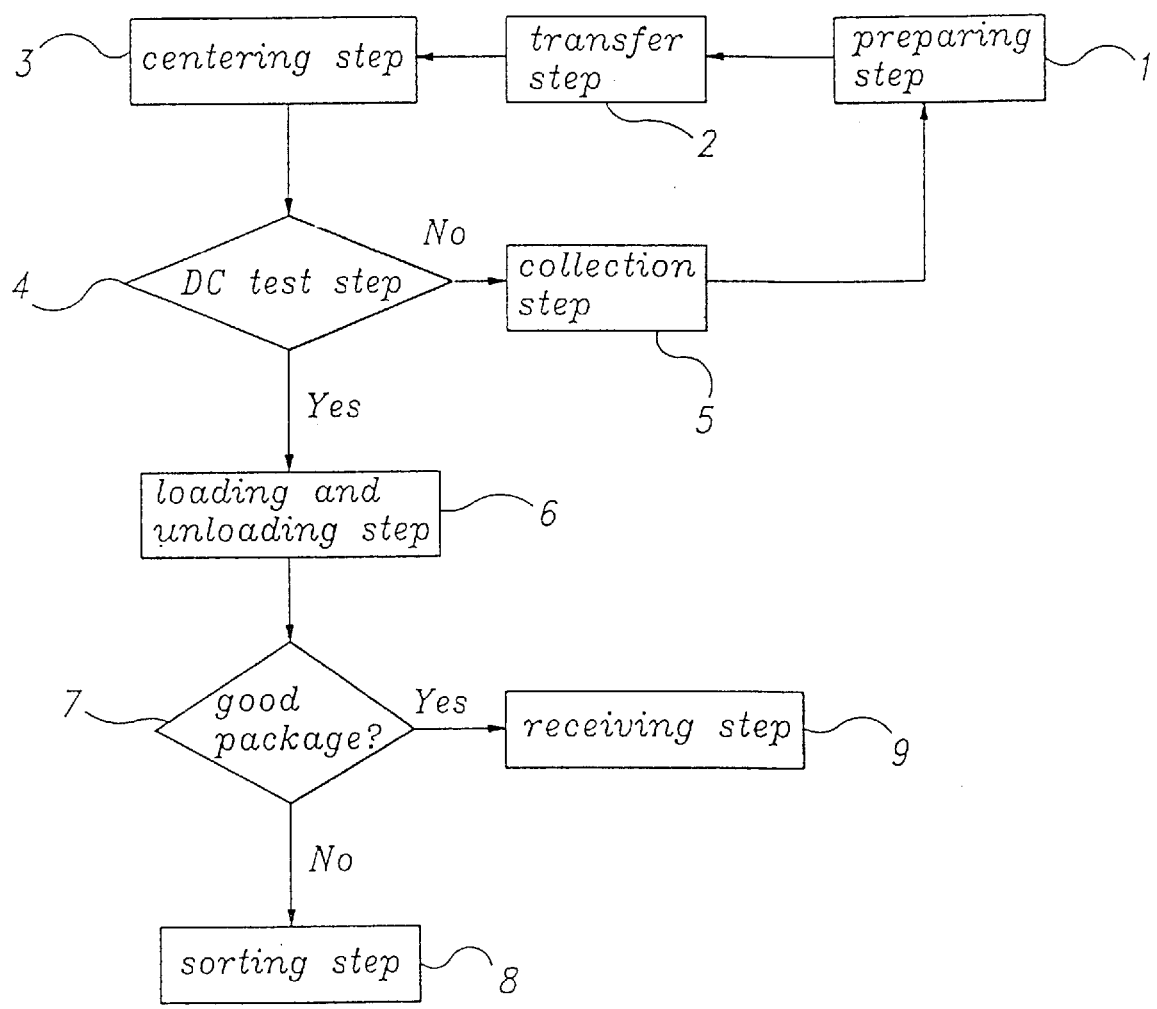
FIG. 2 is a flow chart showing the steps of loading and unloading a semiconductor device package using the apparatus shown in FIG. 1.
Figure 3:
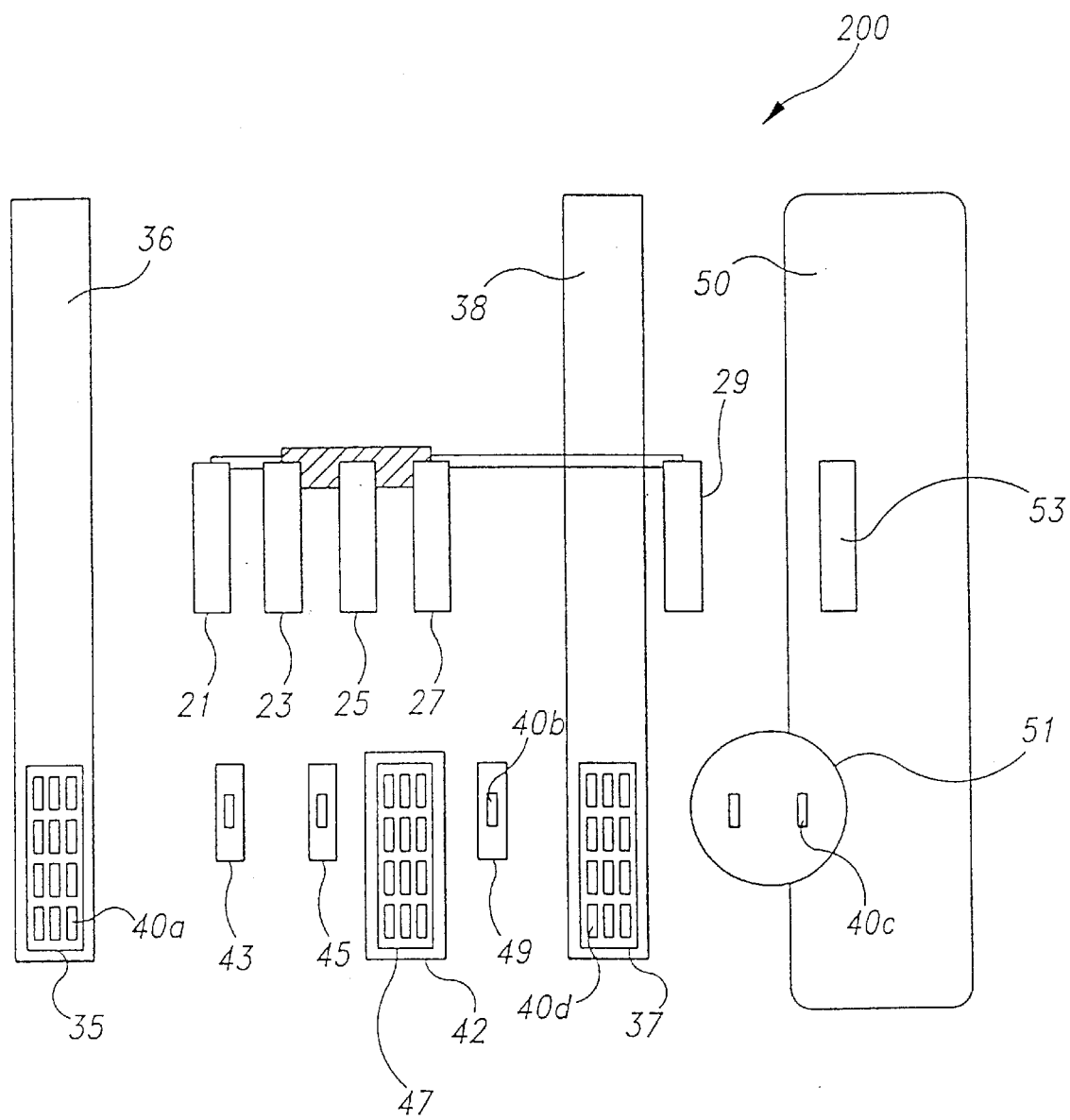
FIG. 3 is a schematic view of a conventional apparatus for loading and unloading a semiconductor device package from a tray-type container.
Figure 4:
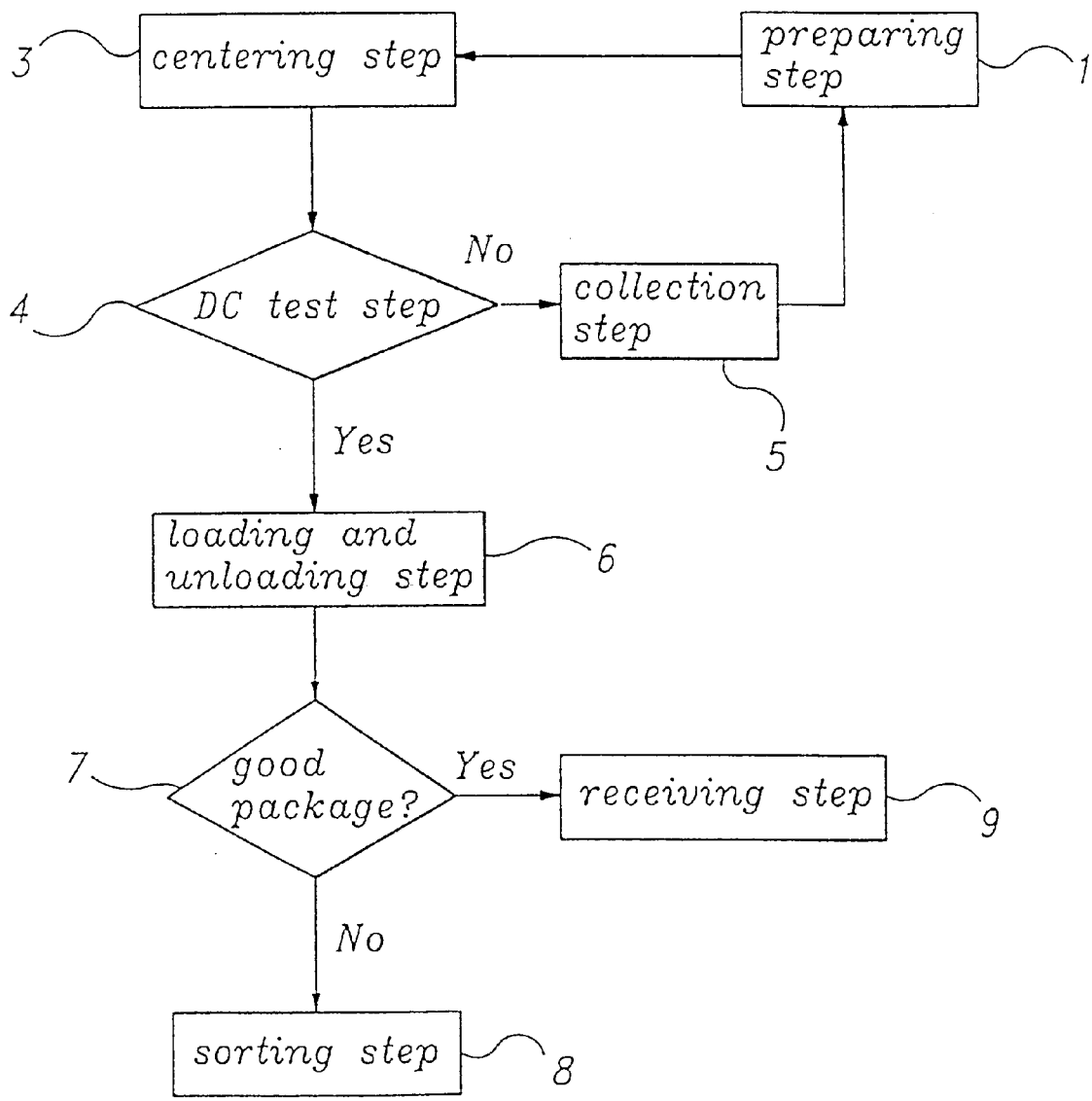
FIG. 4 is a flow chart showing the steps of loading and unloading a semiconductor device package using the apparatus shown in FIG. 3.
Figure 5:
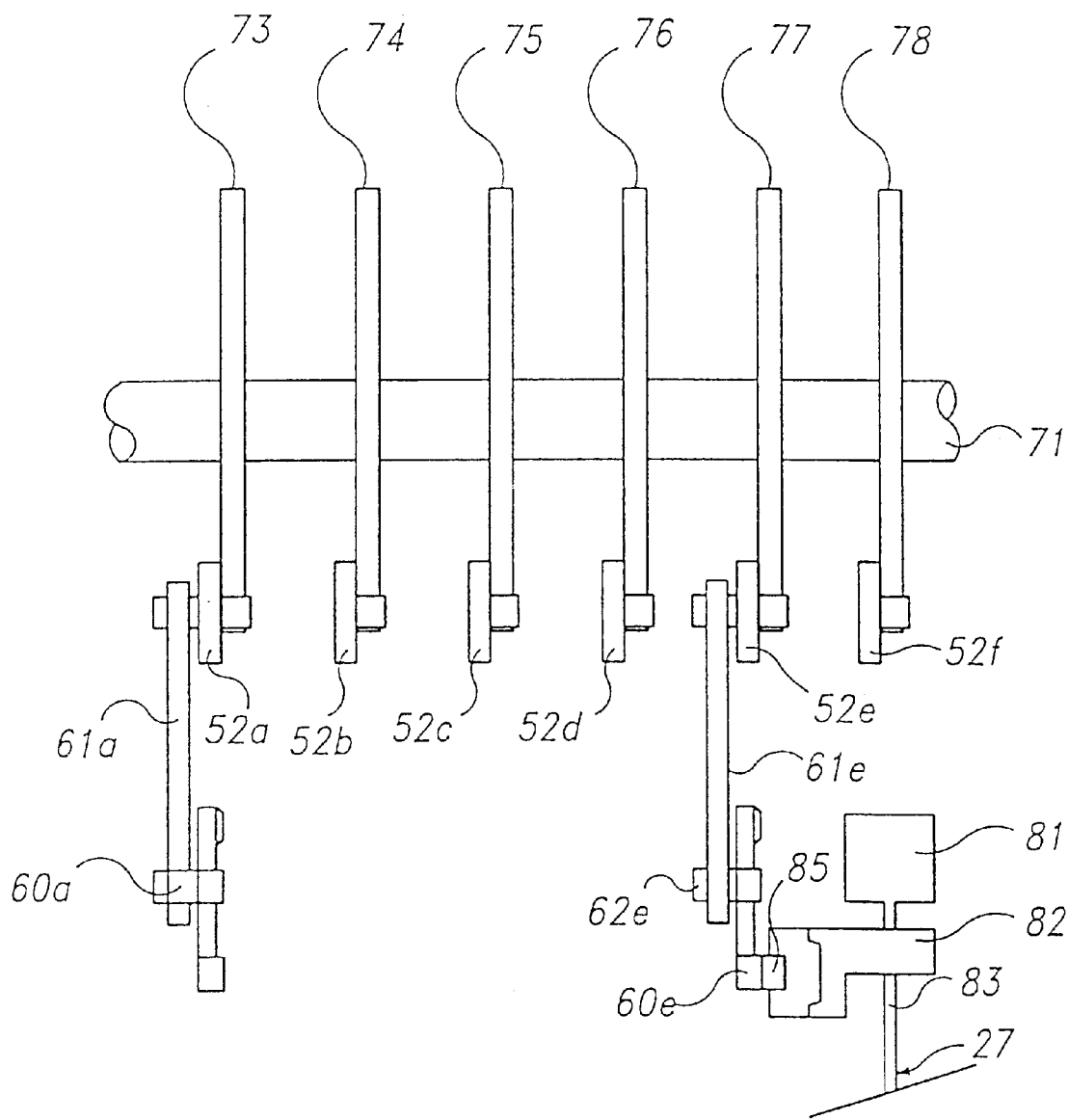
FIG. 5 is a schematic side view of a cam for driving a tool of the apparatuses in FIG. 1 and FIG. 3.
Figure 6:
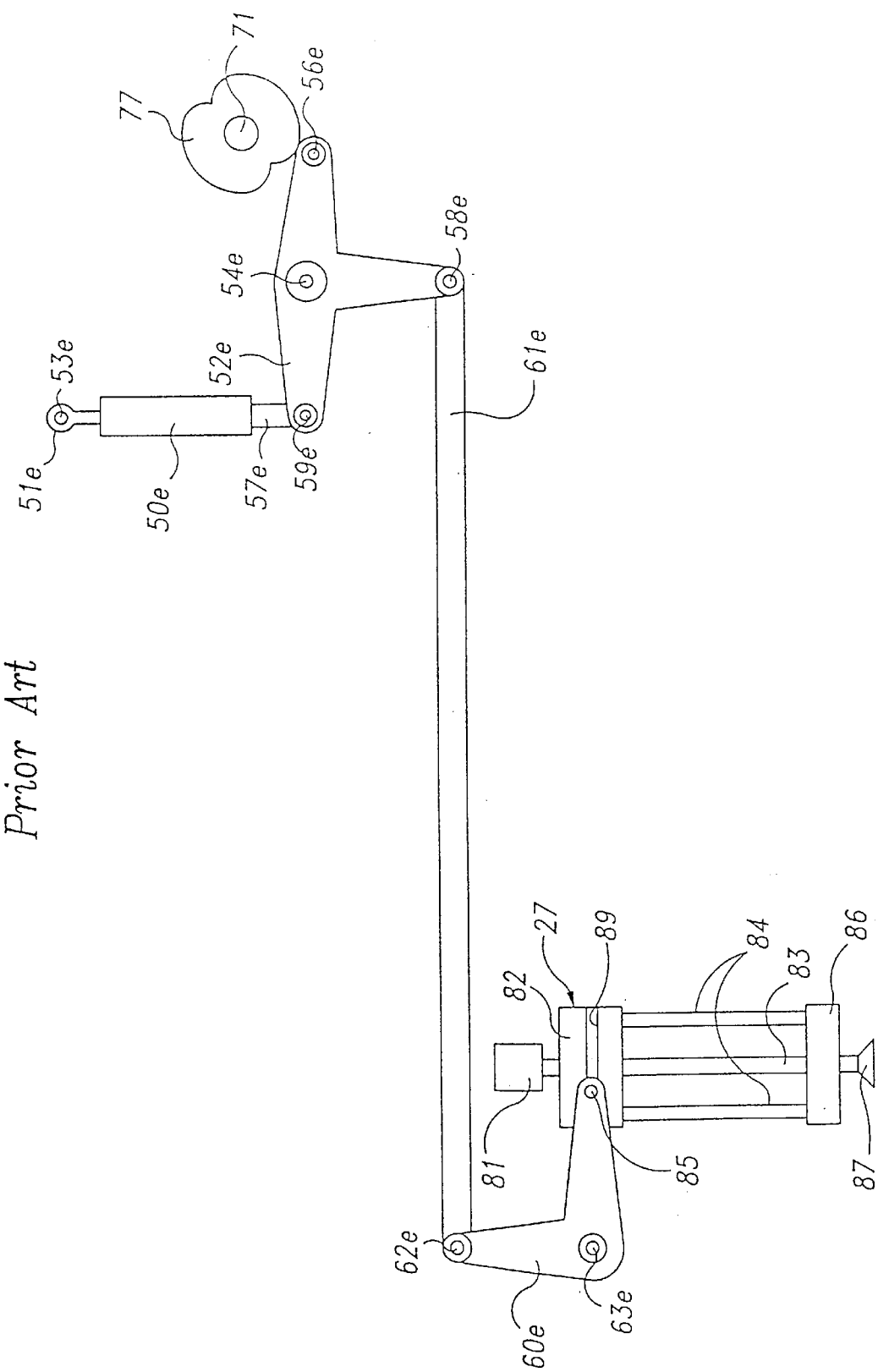
FIG. 6 is a front view of a cam for moving in the vertical direction the tool of the apparatuses in FIG. 1 and FIG. 3.
Figure 7:
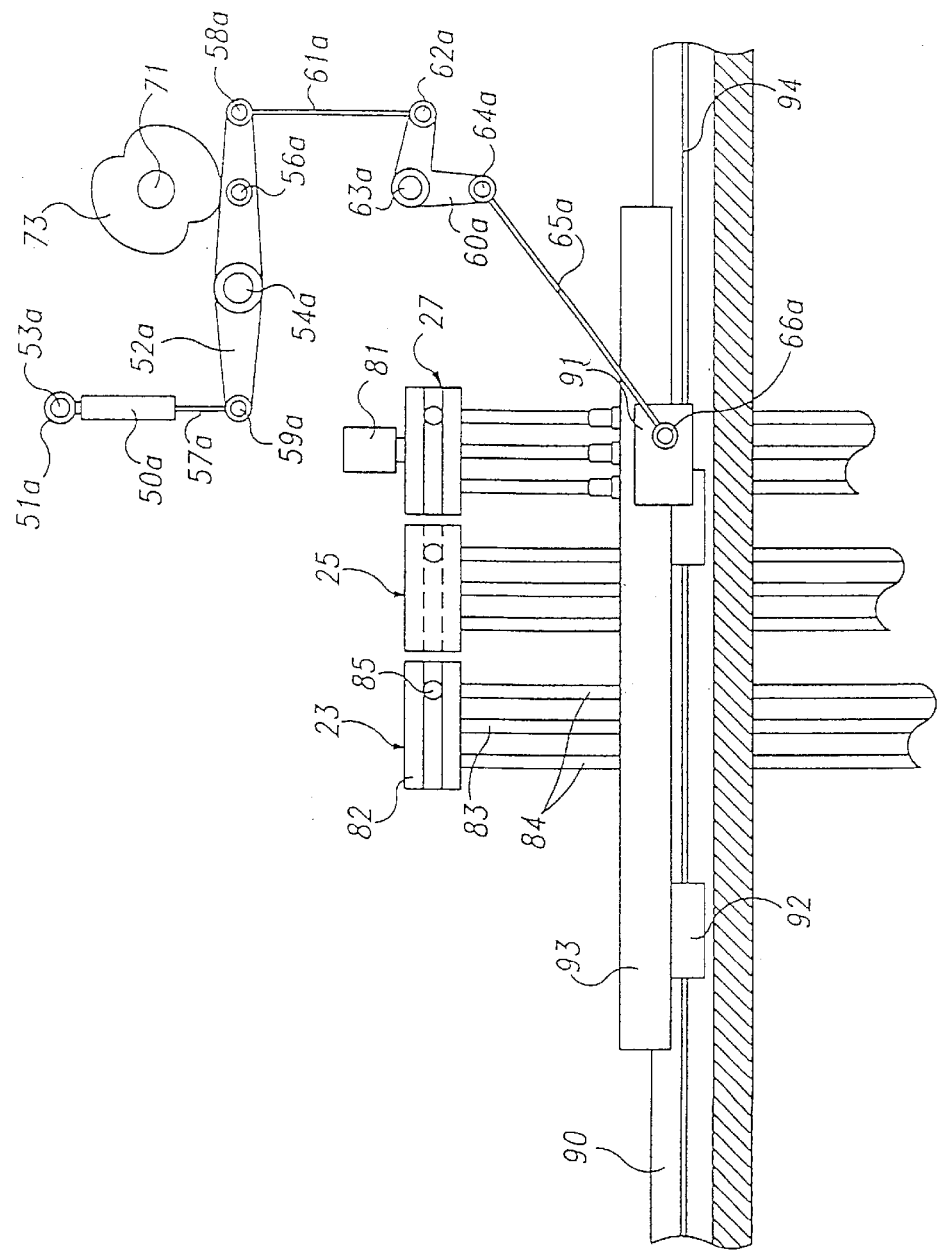
FIG. 7 is a front view of a cam for moving in the horizontal direction the tool of the apparatuses in FIG. 1 and FIG. 3.

The present invention will now be described in detail hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the dimensions of parts and regions are exaggerated for clarity. Like numbers refer to like elements throughout.

The term 'first semiconductor device package' or 'first package' employed throughout the application means that the package has not yet been subjected to a DC test or burn-in test, while the term 'second semiconductor device package' or 'second package' means that the package has been subjected to a DC test as well as burn-in test.

FIG. 8 through FIG. 12 depict a loading and unloading apparatus provided with a servo motor, which apparatus is used for loading and unloading semiconductor device packages into and from test devices.

Figure 8:
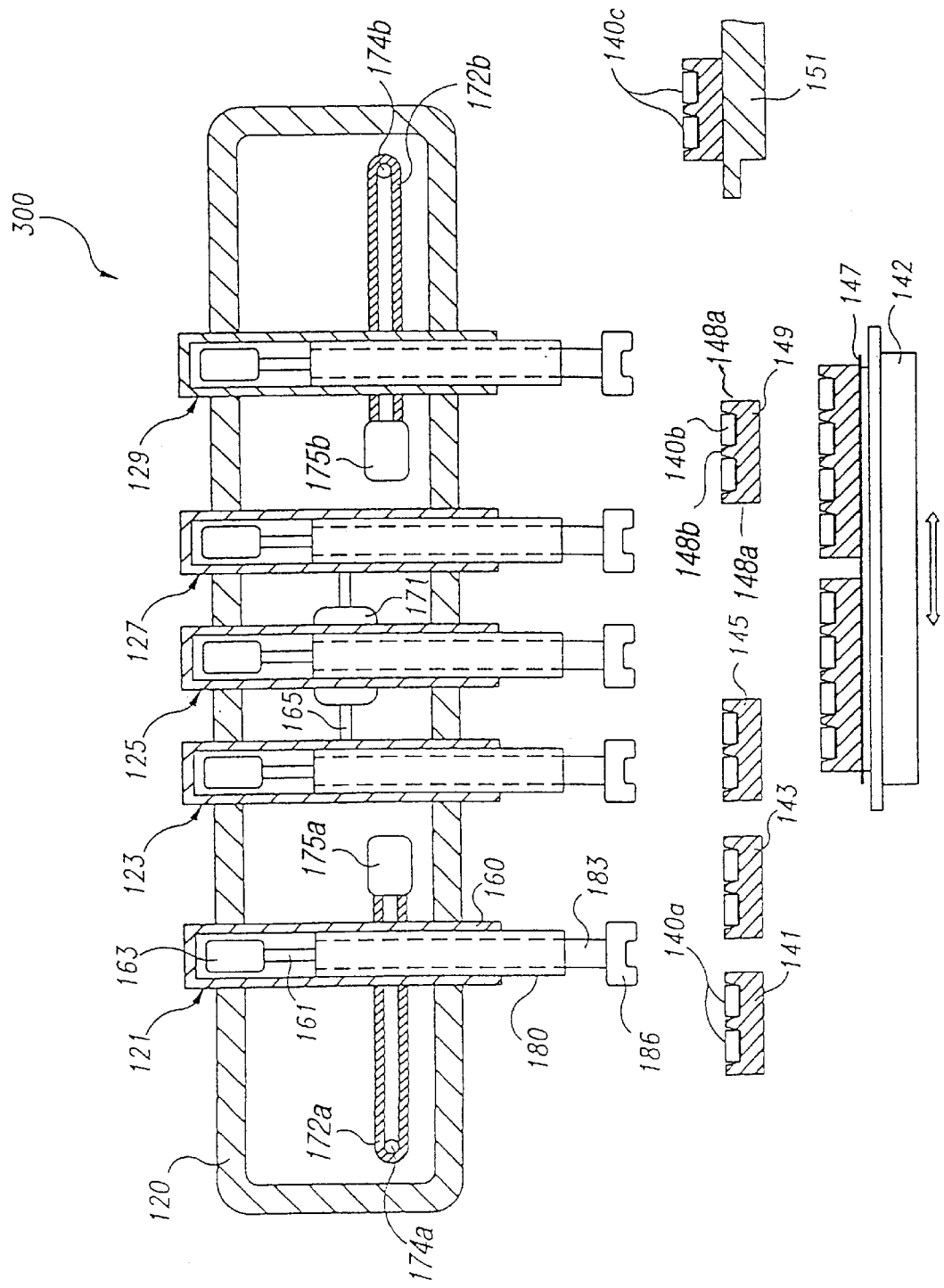
FIG. 8 is a schematic view depicting an apparatus for loading and unloading semiconductor device packages into and from a tube-type container, said apparatus using a servo motor according to one embodiment of the present invention.
Figure 9:
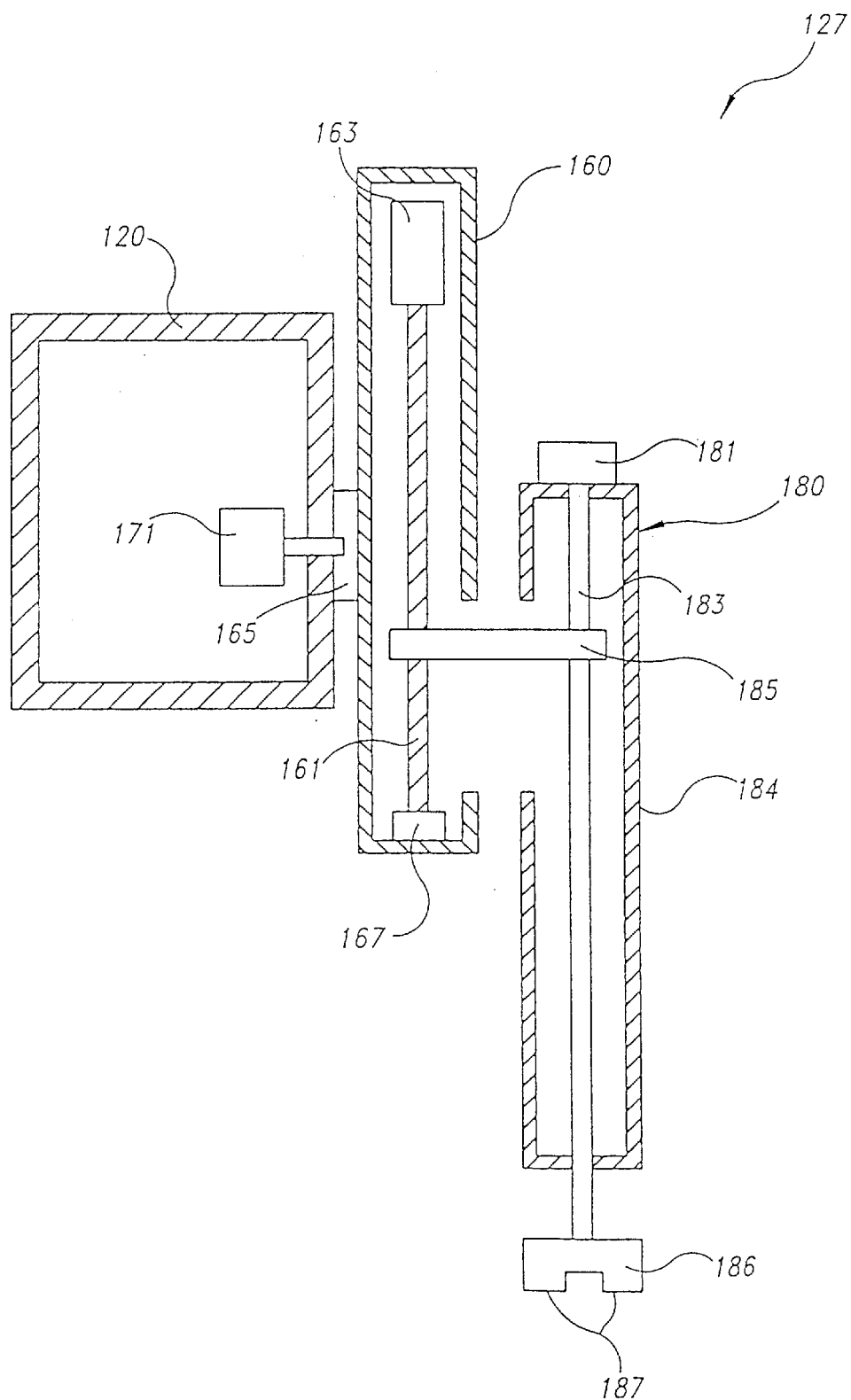
FIG. 9 is a side view depicting the state in which a loading tool provided with a servo motor is installed in a control box.
Figure 10:
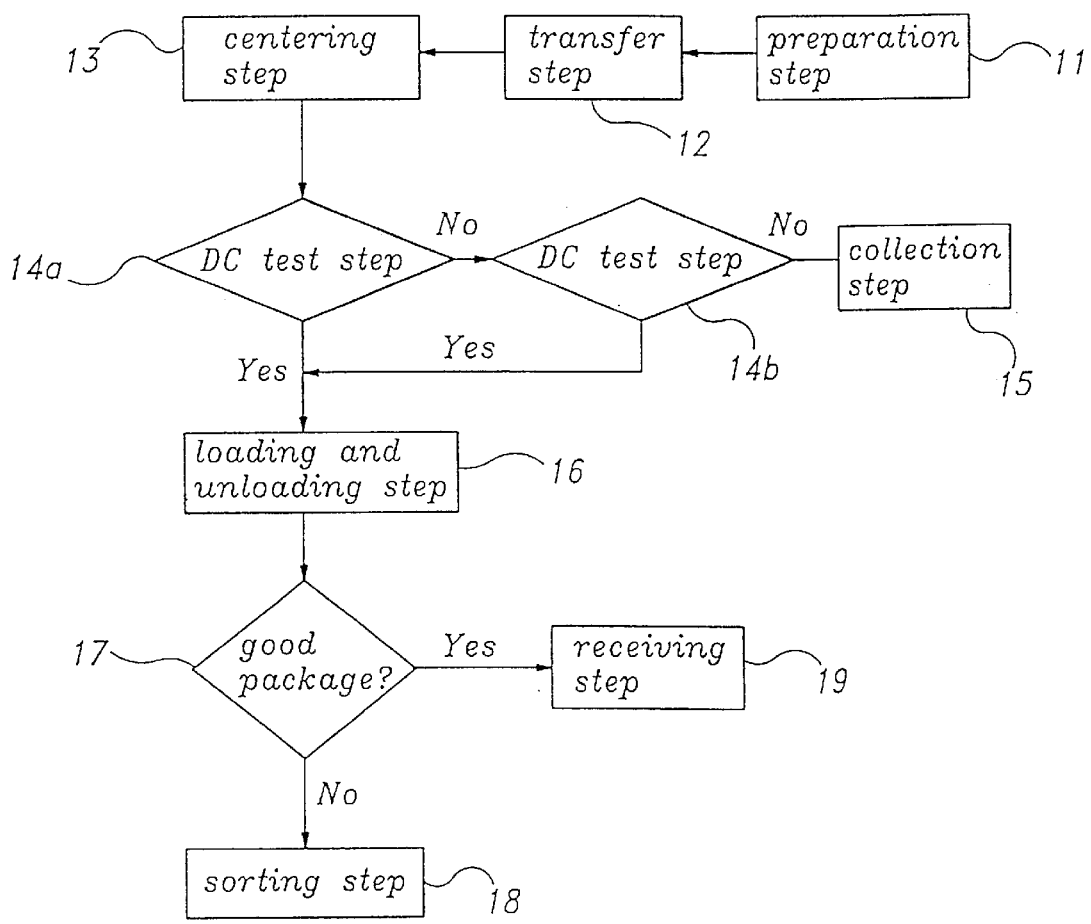
FIG. 10 is a flow chart showing the steps of loading and unloading semiconductor device packages using the apparatus shown in FIG. 8.

FIG. 8 is a schematic view depicting an apparatus for loading and unloading semiconductor device packages into and from a tube-type container, said apparatus being provided with a servo motor according to one embodiment of the present invention; FIG. 9 is a side view depicting the state in which a loading tool provided with servo motors is installed in a control box; FIG. 10 is a flow chart showing the steps of loading and unloading semiconductor device packages using the apparatus shown in FIG. 8; FIGS. 11a through FIG. 11e are plan views depicting in series the inventive apparatus for feeding two semiconductor device package from the tube-type container to a ready station; and FIGS. 12a through FIG. 12e are plan views depicting in series the inventive apparatus for removing the tested packages from a receiving station to an ejection rail.

With reference to FIG. 9, the structure of the removal tool provided with a servo motor will be described. Removal tool 127 is comprised of revolving tool 160 provided with a servo motor 163, and transfer tool 180 coupled to revolving tool 160.

Revolving tool 160 has a servo motor 163 having rod screw 161 with external threads thereon. Rod screw 161 has bearing 167 fitted to its one end, and bearing 167 is placed so as to enable free rotation thereof depending on the rotation of rod screw 161.

Transfer tool 180 has cylinder 184 and transfer rod 183 in cylinder 184. Transfer rod 183 is coupled to rod screw 161 by means of coupling rod 185, and has a tool head 186 at its lower end. Tool head 186 has retrieval part 187, for example a suction means, for picking up two semiconductor device packages. Revolving means 181 such as a revolving cylinder for rotating tool head 186 is provided at an upper end of transfer rod 183.

Removal tool 127 is placed outside control box 120, and a servo motor 171 which drives removal tool 127 in a horizontal direction is provided within control box 120. The outer surface of removal tool 127 is fastened to one side of a coupling block 165, and the servo motor 171 is provided at the other side of coupling block 165.

The vertical movement of removal tool 127 by the action of servo motor 163 in revolving tool 160 will be described. When rod screw 161 starts to rotate by action of servo motor 163, connection rod 185 moves upward and downward along the thread on rod screw 161. Transfer tool 180 coupled to rod screw 161 by means of connection rod 185 also moves upward and downward accordingly.

Removal tool 127 is provided with revolving means 181 so that the removal tool can position the semiconductor device package attached to suction means 187 of tool head 186. Loading tool 121 is similarly provided with a revolving means 181 because loading tool 121 is also required to orient the semiconductor device package. However, the DC test contact tool, insert tool and extension tool, which have the same structure as that of the removal tool, are not provided with revolving means.

Automatic loading and unloading apparatus 300 employed for loading and unloading semiconductor device packages into and from a tube-type container will be described with reference to FIG. 8. The apparatus 300 comprises: a control box 120 in which loading tool 121, DC test contact tool 123, insertion tool 125, removal tool 127 and extension tool 129, each having a servo motor 163, are provided in sequence; ready position 141 having a space for receiving two semiconductor device packages; centering position 143; DC test position 145; XY table 142; receiving position 149; and turntable 151.

In more detail, loading tool 121 and extension tool 129 are provided at the far ends of control box 120, respectively, and DC test contact tool 123, insertion tool 125 and removal tool 127, which are linked together by means of a single connection block 165 and are spaced from each other along the connection block 165, are fixed between loading tool 121 and extension tool 129.

Loading tool 121 is equipped with a timing belt 172a and a servo motor 175a for horizontal movement of the loading tool; and extension tool 129 is equipped with a timing belt 172b and servo motor 175b, so that the two tools can be moved independently. Each timing belt 172a,b is provided with a tension control shaft 174a,b to adjust the tension of the timing belt 175a,b. The tension control shafts 174a,b are located on the timing belts 172a,b at one end of the belts, and the servo motors 175a,b are located at the opposite end of the timing belts 172a,b.

DC test contact tool 123, insertion tool 125 and removal tool 127 are fastened to connection block 165, being spaced from each other, and a servo motor 171 is provided at connection block 165 so as to move these three tools horizontally as a unit.

Ready position 141, centering position 143, DC test position 145, XY table 142, receiving position 149 and turntable 151, all having a space for receiving two semiconductor device packages, are located beneath the tools 121, 123, 125, 127, 129. In more detail, a feeding means 150 comprising a feeding tube 110a and transfer rails 132, and carrying first semiconductor device packages, is moved into place near loading tool 121. This feeding means is not shown in FIG. 8, but is located in a similar position to feeding tube 10a and transfer rails 32 in FIG. 1 (see also FIGS. 11a–e). The first two packages freely drop down the transfer rails 132 into ready position 141, where two packages are loaded in parallel. This feeding means 150 for feeding of first packages 140a from the feeding tube to ready position 141 will be described later with reference to FIG. 11a through FIG. 11e.

Centering position 143, DC test position 145 and receiving position 149 are provided in turn spaced from ready position 141. Centering position 143 is provided within the working area accessible to loading tool 121 and DC test contact tool 123. DC test position 145 is provided within the working area accessible to DC test contact tool 123 and insertion tool 125. Receiving position 149 is provided within the working area accessible to removal tool 127 and extension tool 129.

XY table 142, onto which a burn-in board is mounted, is provided between DC contact position 145 and receiving position 149. Turntable 151 is provided beyond receiving position 149, and turntable 151 transfers defective second packages 140c to the sorting station of the apparatus. XY table 142 is provided for horizontally and sequentially loading and unloading first packages 140a and second packages 140b into and from burn-in sockets of burn-in board 147. XY table 142 is provided within the working areas accessible to insertion tool 125 and removal tool 127. Second packages 140b are removed from burn-in board 147 and loaded into receiving position 149 by means of removal tool 127, and sorted depending on the burn-in test results. If the test result is good, the second package 140b is placed into a receiving means 250, while if the test result is not good, the second package 140b is transferred to turntable 151 by means of extension tool 129. Receiving means 250 is not shown in FIG. 8, but is located similarly to transfer rails 34 shown in FIG. 1.

The receiving means 250 for placing good second package 140b into the receiving tube will be described later with reference to FIGS. 12a through 12e.

The process for loading first semiconductor device packages into the burn-in board and for unloading and sorting second semiconductor device packages by using io the apparatus having servo motors will be described with reference to FIG. 8 through FIG. 10.

Referring to FIG. 10, in a preparation step 11 a tube-type container carrying first semiconductor device packages 140a is provided, and burn-in board 147 having a burn-in socket loaded with second semiconductor device package 140b is provided on XY table 142. In transfer step 12, first package 140a is transferred to ready position 141 by free falling due to gravity. Two first semiconductor device packages 140a are loaded into ready position 141.

In centering step 13, first packages 140a are picked up by tool head 186 of loading tool 121 and centered on centering position 143 by the rotation of transfer rod 183 by the action of revolving means 181 of loading tool 121.

The centered first packages 140a are loaded into the test socket of DC test position 145 by DC test contact tool 123 and subjected to a DC test in DC test step 14a for their electrical characteristics.

If the first package(s) fails the DC test, it is subjected to retesting at DC test step 14b by the independent vertical movement of DC test contact tool 123. If the first package(s) 140a fails the second DC test, it is then transferred to collection step 15. The packages in collection step 15 are not returned to preparation step 11, unlike in the conventional apparatus. Meanwhile, at loading and unloading step 16, the good first package is loaded into the burn-in socket by means of insertion tool 125 and, at the w same time, second package 140b, which has already been burn-in tested, is unloaded from the burn-in socket by way of removal tool 127. Similarly, a first package 140a which failed the first DC test at step 14a but passed the second DC test at step 14b is also loaded into the burn-in socket by means of insertion tool 125 at loading and unloading step 16. The second package 140b unloaded from the burn-in socket is transferred to receiving position 149, where the package 140b is transferred by extension tool 129, either in receiving step 19 if it is good, or at sorting step 18 if it is defective, depending on the test results.

DC test contact tool 123, insertion tool 125 and removal tool 127 are fastened to connection block 165 so that these three tools can uniformly move in the horizontal direction. Moreover, these three tools can move independently or uniformly in the vertical direction by the action of servo motors 163 coupled to the respective tools 123, 125 and 127. Nevertheless, in the steps 14a,b and 16 for picking up, and loading and unloading DC test contact tool 123, insertion tool 125 and removal tool 127, preferably uniformly move in the vertical direction. Since the position of XY table 142 is lower than those of centering position 143, DC test position 145 and receiving position 149, insert tool 125 moves a longer distance downward when it loads first package 140a, while removal tool 127 moves a longer distance downward when it picks up second package 140b.

The time of one cycle for loading the first package into the burn-in board and for unloading the second package from the burn-in board is about 2.1 seconds.

Herein, the loading and unloading apparatus according to the present invention requires a separate feeding means as well as receiving means for feeding and receiving two packages at the same time, respectively, while the cam-driven conventional apparatus does not require such separate means since only one package moves within the apparatus.

The feeding means for feeding two packages from the feed tray to the ready position and the receiving means for loading two packages from the receiving position to the receiving tube will be described hereinafter.

With reference to FIG. 11a through FIG. 11e, the feeding means 150 for feeding two packages from a tube-type container into ready position 141 comprises tube loading means 190 for supporting feed tube 110a carrying first semiconductor device packages 140a (which are numbered in FIGS. 11a–e as 240, 240a and 240b for clarity); single transfer rail 132 along which the first package 240 freely falls from tube 110a; separator 159 having two spaces each for receiving first package 240; and dual transfer rails 136a,b located under separator 159 and spaced apart from one another so as to conform to ready position 141. Separator 159 is provided with a driver (not shown) as known to those of skill in the art, as indicated by the arrows, for moving the separator 159 back and forth so as to be aligned with either one of the dual transfer rails 136a,b.

Tube loading means 190 tilts feed tube 110a so that the feed tube is at an angle with respect to horizontal in order to freely drop first package 240 from feed tube 110a. Tube loading means 190 is provided at or near where tubes 110a terminate. Tube loading means 190 has tube loader aim 191 for securing feed tube 110a. One end of tube loader arm 191 is fastened to revolving means 192 such as a revolving cylinder so that tube loader arm 191 rotates by the action of revolving means 192 and feed tube 110a can be tilted to have the same angle as that of single transfer rail 132, thereby allowing first package 240 into feed tube 110a to fall down onto single transfer rail 132.

Figure 11A:
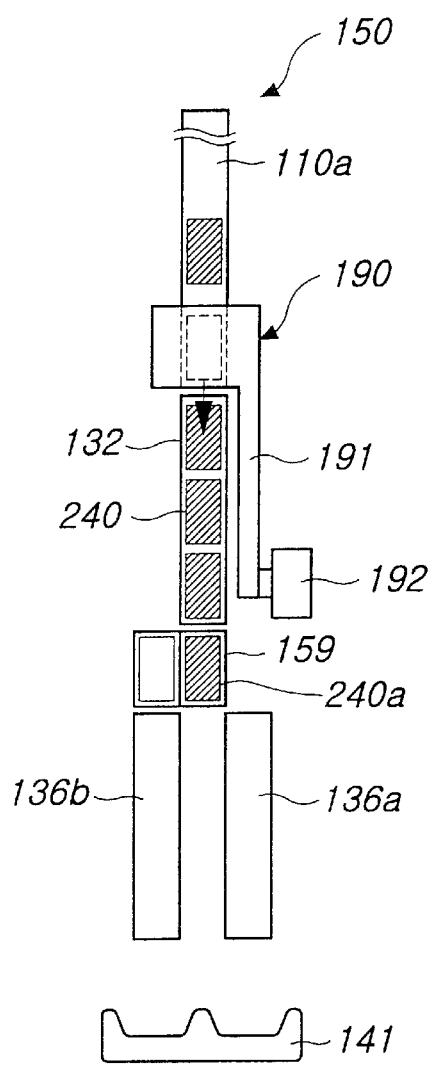
Figure 11B:
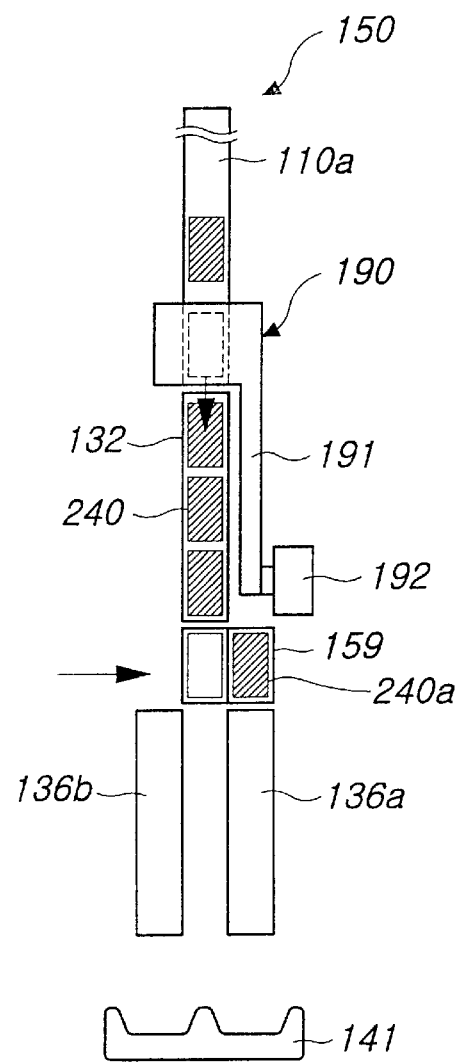

As shown in FIGS. 11a and 11b, one first semiconductor device package 240a is dropped from feed tube 110a into single transfer rail 132 by means of tube loading means 190 and is introduced into the right receiving space of separator 159. Separator 159 is then moved to the right by the driving means (not shown) and aligned with right transfer rail 136a. First package 240a in the right receiving space of separator 159 is dropped along the right transfer rail 136a and loaded into the right receiving space of ready position 141.

As shown in FIGS. 11c and 11d, a new first package 240b is loaded into the left receiving space of separator 159 which is now moved to the right. Separator 159 carrying first package 240b in its left receiving space is moved to the left to align with the left rail 136b, and first package 240b falls along the left rail 136b into the left receiving space of ready position 141. Therefore, two first packages 240 are loaded into ready position 141.

By repeating the procedure described above, two first packages can be loaded into the ready position within one loading/unloading cycle of the apparatus. Therefore, time spent loading a first package into the ready position is minimized.

With reference to FIG. 12a through FIG. 12e, the receiving means 250 for unloading two good semiconductor device packages after burn-in testing from the receiving position into the ejection rail and tube-type receiving container will be described. Receiving means 250 is provided coplanar with receiving position 149, and comprises separators 152, 153, pusher parts 155, 156, 157, and air feeding ejection rail 134.

Receiving position 149 has two cavities 148a for receiving two second semiconductor device packages 140d, and pusher rail 148b between two cavities 148a.

Separators 152, 153 having receiving spaces 152a, 153a corresponding to receiving cavity 148a of receiving position 149 are provided in series above receiving position 149 and linked to a driving means (not shown) for horizontal movement. Separators 152, 153 can move independently in the horizontal direction.

Pusher parts 155, 156, 157 are comprised of side pushers 156, 157 provided corresponding to receiving cavities 148a of receiving position 149 to move second packages in receiving position 149 to separators 152, 153; and center pusher 155 to push second packages into air feeding ejection rail 134 by moving along pusher rail 148b.

Air feeding ejection rail 134 is provided so as to correspond to the position of center pusher 155. Herein, the separator near receiving position 149 is called first separator 152, and the other separator above first separator 152 is called second separator 153.

Air feeding ejection rail 134 is provided above second separator 153, and the receiving tube (not shown) for receiving good second package 140b (numbered 140d in FIGS. 12a–12e for clarity) is provided above air feeding ejection rail 134.

The process for loading good second semiconductor device package 140d from receiving position 149 into the receiving tube (not shown) will be described hereinafter. Second package 140d, which is considered good, is unloaded from the burn-in socket of the burn-in board and loaded into receiving position 149 by means of remove tool 127. Alternatively, when the second package is defective, it is transferred to the sorting station by means of extension tool 129. A good second package is loaded into the separators 152, 153 as follows: left side pusher 156 moves the package 140d in the left cavity 148a of receiving position 149 into the left space 153a of second separator 153, while the right side pusher 157 moves the package 140d in the right cavity 148a of receiving position 149 into the right space 152a of first separator 152.

Then, first separator 152 carrying second package 140d moves leftward, and u second separator 153 carrying second package 140d moves rightward so that the spaces receiving second packages 140d can be aligned to air feeding eject rail 134. Thereafter, the second packages 140d are transferred to air feeding ejection rail 134 by means of center pusher 155.

Second packages 140d are then loaded into the receiving tube (not shown) in an air feeding manner to complete the receiving step.

By repeating the procedure described above, two second packages can be loaded at once into the receiving tube.

Figure 13:
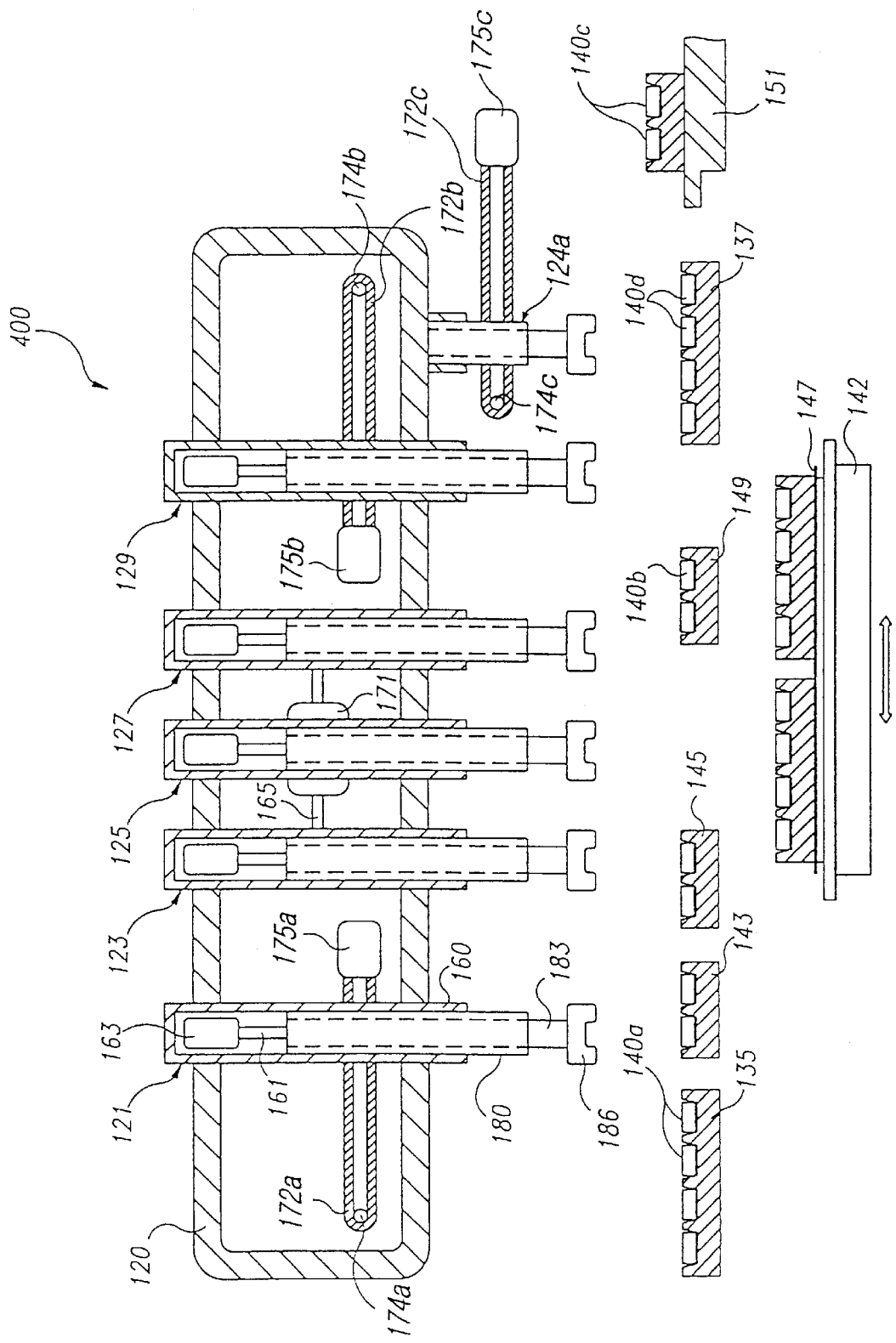
FIG. 13 is a schematic view depicting an apparatus for loading and unloading semiconductor device packages from a tray-type container, said apparatus using a servo motor according to another embodiment of the present invention.
Figure 14:
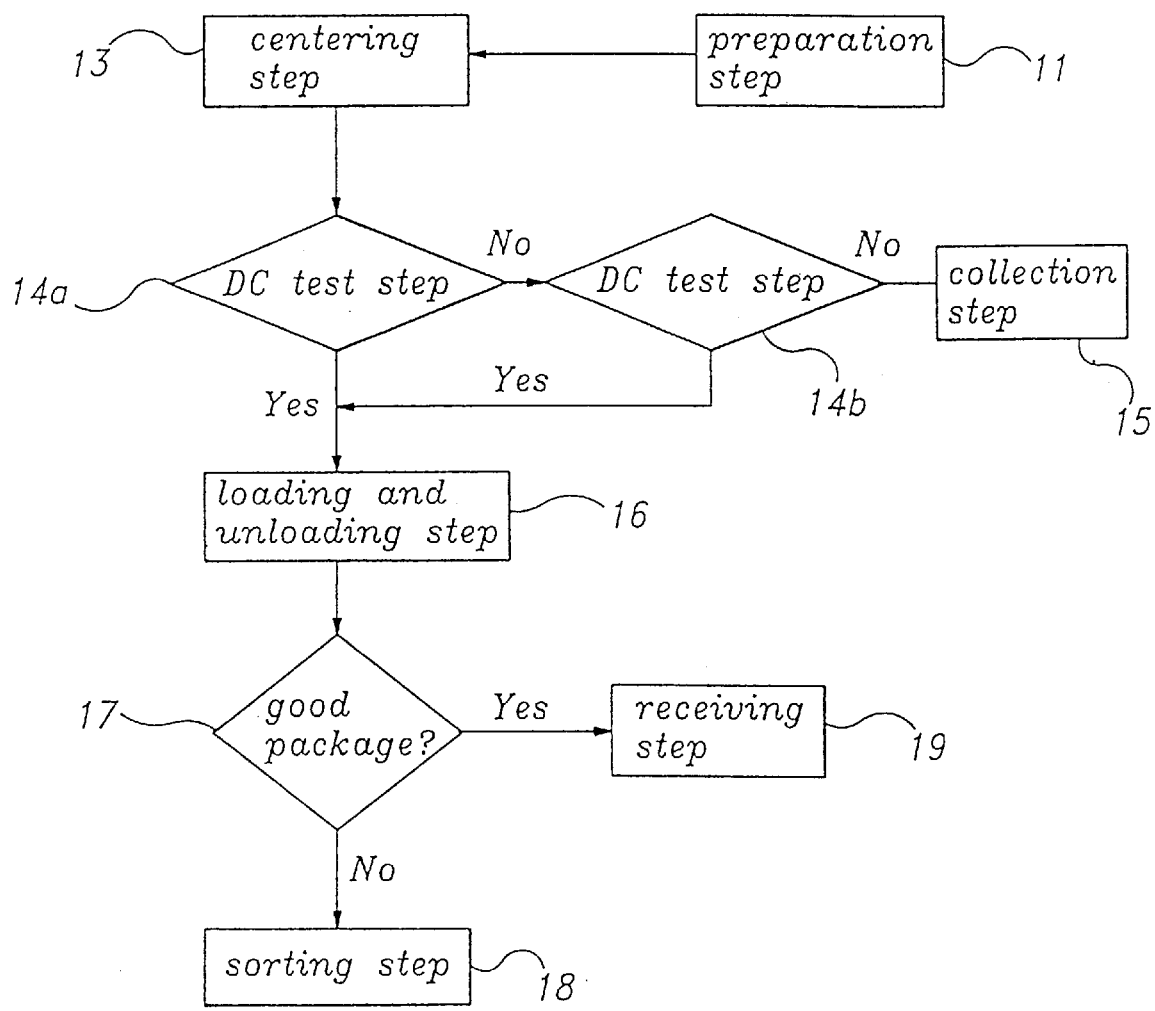
FIG. 14 is a flow chart showing the steps of loading and unloading semiconductor device packages using the apparatus shown in FIG. 13.

FIG. 13 is a schematic view depicting an apparatus for loading and unloading semiconductor device packages from a tray-type container, said apparatus using a servo motor according to another embodiment of the present invention; and FIG. 14 is a flow chart showing the steps of loading and unloading semiconductor device packages using the apparatus shown in FIG. 13.

With reference to FIG. 13 and FIG. 14, the loading and unloading apparatus 400 according to a second embodiment of the present invention does not need a separate ready position since first semiconductor device packages 140a are directly fed into feed tray 135. The apparatus 400 comprises a receiving tool 124 provided near extension tool 129, which receiving tool 124 is for loading good second packages 140d of second packages 140b on receiving position 149 into receiving tray 137. Loading tool 121, extension tool 129 and receiving tool 124 are each linked to a respective one of timing belts 172a,b and c so that receiving tool 124 can be moved horizontally independent of loading tool 121 and extension tool 129. Timing belt 172c is linked to receiving tool 124, since the distance of horizontal movement of receiving tool 124 varies depending on the position of second package 140d during the process of loading second package 140d into receiving tray 137. The remaining structure of loading and unloading apparatus 400 is the same as that of the apparatus 300 shown in FIG. 8.

The process for loading a semiconductor device package before the burn-in test into the burn-in board and for unloading a semiconductor device package after the burn-in test from the burn-in board by using the automatic apparatus 400 will be described below.

With reference to FIG. 14, the steps are as follows: in preparation step 11, tray 135 carrying first semiconductor device packages 140a is provided near centering position 143; then in centering step 13, first semiconductor device packages 140a in feed tray 135 are moved to centering position 143 by means of loading tool 121, and first packages 140a are moved to centering position 143 while being aligned by action of revolving means 181 of loading tool 121. At this time, burn-in board 147 carrying second semiconductor devices 140b after burn-in test is provided on XY table 142.

Steps 14a and b, 15, 16 and 17, of transferring the first packages to DC test position 145 through transferring the second packages to position 149 after burn-in w testing are the same as those described in relation to the apparatus in FIG. 8 and are omitted here for the simplicity.

Second package 140b, if it is considered defective, is transferred to turntable 151 for sorting step 18 by way of extension tool 129, while if considered good, is loaded into receiving tray 137 by means of receiving tool 124 in receiving step 19.

The time required from the step of loading two first semiconductor device packages into a burn-in board to the step of sorting second semiconductor device packages is about 2.1 seconds.

Accordingly, the present invention has advantages over the conventional apparatus in that the inventive apparatus allows for retesting of a semiconductor device package which is considered defective by the first DC test results, since the DC test tools of the inventive apparatus can move independently in vertical direction. Further, the inventive apparatus is advantageous in that it requires a time of about 2.1 seconds for one cycle of loading and unloading two packages, while the conventional apparatus requires about 1.5 to 1.8 seconds for one cycle of loading and unloading one package for the tube-type container or tray-type container, respectively, thereby allowing an increase in the yield.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. An apparatus for loading semiconductor device packages into a burn-in board, and for unloading semiconductor device packages after a burn-in test from the burn-in board, said apparatus comprising:
 a feeder providing a feed tube carrying said semiconductor device packages, wherein said feeder comprises;
  a tube loader supporting the feed tube carrying the semiconductor device packages,
  a single transfer rail for transferring the semiconductor packages by free falling from the feed tube,
  a dual transfer rail separated from said single transfer rail, said dual transfer rail comprising a first transfer rail and a second transfer rail, and
  separators for feeding the semiconductor device packages from said single transfer rail to said dual transfer rail, said separators being provided between said single transfer rail and said dual transfer rail, wherein each of said separators comprise a body having a first and a second cavity for receiving said two semiconductor device packages, said body moving in a horizontal direction into alignment with each of said first and second transfer rails in turn, such that when, in a first state, said first cavity is aligned with said first transfer rail and said second cavity is aligned with said single transfer rail, there through one of said semiconductor device packages in said single transfer rail is transferred to said second cavity and one of said two semiconductor device packages in said first cavity is transferred to said first transfer rail simultaneously, and when, in a second state, said first cavity is aligned with said single transfer rail and said second cavity is aligned with said second transfer rail, there through one of said semiconductor device packages in said single transfer rail is transferred to said first cavity and one of said two semiconductor device packages in said second cavity is transferred to said second transfer rail simultaneously;
 a loading tool for transferring two semiconductor device packages from said feed tube, one semiconductor device package from each of said first and second transfer rails, to a centering position;
 a DC test contact tool for transferring said two semiconductor device packages from said centering position to a DC test position where a DC test is performed;
 an insertion tool for loading said two semiconductor device packages after the DC test into a burn-in socket in a burn-in board where the bun-in test is performed;
 a removal tool for unloading said two semiconductor device packages after the burn-in test from said burn-in board and for transferring said two semiconductor device packages to a receiving position; and
 a sorting station for classifying said two semiconductor device packages depending on burn-in test results,
 each of said loading tool, said DC test contact tool, said insertion tool and said removal tool further comprising:
  a revolving tool provided with a servo motor having a rod screw;
  a transfer rod coupled to said rod screw via a connection rod; and
  a tool head for picking up said two semiconductor device packages and coupled to a lower part of said transfer rod; wherein said servo motor drives the transfer rod in a vertical direction and said two semiconductor device packages are loaded and unloaded via vertical movement of said transfer rod.

2. The apparatus according to claim 1, wherein said loading tool and said removal tool further comprise a rotation cylinder coupled to an upper end portion of said transfer rod.

3. The apparatus according to claim 1, wherein said connection rod is fastened to said transfer rod and is fitted into said rod screw so that said connection rod can be vertically moved along said rod screw by rotation of said rod screw.

4. The apparatus according to claim 1, further comprising:
 a ready position having receiving spaces for receiving two of said semiconductor device packages from said feed tube, wherein said feeder feeds said two semiconductor device packages to said ready position.

5. The apparatus according to claim 1, where in said separators comprise a body having two cavities for receiving the semiconductor device packages, said body being coupled to a driver which moves said body in horizontal direction into alignment with each of said dual transfer rails in turn, such that one of said semiconductor device packages in one of said two cavities passes out of the cavity and into one of said dual transfer rails.

6. The apparatus according to claim 1, said sorting station further comprising:
 a receiver which loads said two semiconductor device packages into a receiving tube if said two semiconductor device packages are considered good based upon burn-in test results; and
 an extension tool for transferring said two semiconductor device packages to a turntable if said two semiconductor device packages are considered defective based upon burn-in test results.

7. The apparatus according to claim 6, said extension tool further comprising a timing belt, said extension tool being movable in a horizontal direction along said timing belt.

8. The apparatus according to claim 1, said loading tool further comprising a timing belt, said loading tool being movable in a horizontal direction along said timing belt.

9. The apparatus according to claim 1, wherein said DC test contact tool, said insertion tool and said removal tool are spaced apart from each other and fastened to a connection block, and wherein said connection block is provided with a servo motor so that said connection block can be moved in a horizontal direction.

10. An apparatus for loading semiconductor device packages into a burn-in board, and for unloading semiconductor device packages after a burn-in test from the burn-in board, said apparatus comprising:
 a feeder providing a feed tube carrying the semiconductor device packages;
 a loading tool for transferring two semiconductor device packages from said feed tube to a centering position;
 a DC test contact tool for transferring said two semiconductor device packages from said centering position to a DC test position where a DC test is performed;
 an insertion tool for loading said two semiconductor device packages after DC test into a burn-in socket in a burn-in board where the burn-in test is performed;
 a removal tool for unloading said two semiconductor device packages after the burn-in test from said burn-in board and for transferring said two semiconductor device packages to a receiving position;
 a receiver which loads said two semiconductor device packages into a receiving tube if said two semiconductor device packages are considered good based upon burn-in test results, said receiver comprising:

a receiving position having two cavities for receiving said two semiconductor device packages after the burn-in test, a pusher rail located between said two cavities; pusher parts comprising a first and a second side pushers, each of said first and second side pushers located in said cavities, and a center pusher aligned with said pusher rail, an air feeding ejection rail located aligned with said center pusher and separated from said receiving position, and separators located between said receiving position and said air feeding ejection rail, said separators comprising: a first separator having a first cavity and a second cavity, said first separator located near said receiving position; and a second separator having a third cavity and a fourth cavity, said second separator located near said air feeding ejection rail in contact with said first separator, wherein said first side pusher pushes one of said two semiconductor device packages from said receiving position to said second cavity, while said second side pusher pushes the other of said two semiconductor device packages from said receiving position to said third cavity, thereafter said two semiconductor device packages transferred to and loaded into said receiving tube simultaneously by said center pusher such that said second and third cavities are aligned with said air feeding ejection rail; and an extension tool for transferring said two semiconductor device packages to a turntable if said two semiconductor device packages are considered defective based upon burn-in test results, each of said loading tool, said DC test contact tool, said insertion tool and said removal tool further comprising:
  a revolving tool provided with a servo motor having a rod s crew;
  a transfer rod coupled to said rod screw via a connection rod; and
  a tool head for picking up said two semiconductor device packages and coupled to a lower part of said transfer rod; wherein said servo motor drives the transfer rod in a vertical direction and said two semiconductor device packages are loaded and unloaded via vertical movement of said transfer rod.

11. The apparatus according to claim 10, wherein said two side pushers operate simultaneously in a same direction.

12. An apparatus for loading semiconductor device packages into a burn-in board, and for unloading semiconductor device packages after a burn-in test from the burn-in board, said apparatus comprising:
  a feeder providing a feed tube carrying the semiconductor device packages, wherein said feeder comprises:
    a tube loader supporting the feed tube carrying the semiconductor device packages,
    a single transfer rail for transferring the semiconductor device packages by free falling from the feed tube,
    a dual transfer rail separated from said single transfer rail, said dual transfer rail comprising a first transfer rail and a second transfer rail, and
    separators for feeding the semiconductor device packages from said single transfer rail to said first and second transfer rails, said separators being provided between said single transfer rail and said first and second transfer rails;
  a loading tool for transferring two semiconductor device packages from said feed tube, one semiconductor device package from each of said first and second transfer rails, to a centering position;
  a DC test contact tool for transferring said two semiconductor device packages from said centering position to a DC test position where a DC test is performed;
  an insertion tool for loading said two semiconductor device packages after the DC test into a burn-in socket in a burn-in board where the burn-in test is performed;
  a removal tool for unloading said two semiconductor device packages after the burn-in test from said burn-in board and for transferring said two semiconductor device packages to a receiving position;
  a receiver which loads said two semiconductor device packages into a receiving tube if said two semiconductor device packages are considered good based upon burn-in test results, said receiver comprising:
    a receiving position having two cavities for receiving said two semiconductor device packages after the burn-in test,
    a pusher rail located between said two cavities; pusher parts comprising a first and a second side pushers, each of said first and second side pushers located in said cavities, and a center pusher aligned with said pusher rail,
    an air feeding ejection rail located aligned with said center pusher and separated from said receiving position, and
    separators located between said receiving position and said air feeding ejection rail, said separators comprising: a first separator having a first cavity and a second cavity, said first separator located near said receiving position; and a second separator having a third cavity and a fourth cavity, said second separator located near said air feeding ejection rail in contact with said first separator,
    wherein said first side pusher pushes one of said two semiconductor device packages from said receiving position to said second cavity, while said second side pusher pushes the other of said two semiconductor device packages from said receiving position to said third cavity, thereafter said two semiconductor device packages transferred to and loaded into said receiving tube simultaneously by said center pusher such that said second and third cavities are aligned with said air feeding ejection rail; and
  an extension tool for transferring said two semiconductor device packages to a turntable if said two semiconductor device packages are considered defective based upon burn-in test results,
  each of said loading tool, said DC test contact tool, said insertion tool and said removal tool further comprising:
    a revolving tool provided with a servo motor having a rod screw;
    a transfer rod coupled to said rod screw via a connection rod; and
    a tool head for picking up said two semiconductor device packages and coupled to a lower part of said transfer rod; wherein said servo motor drives the transfer rod in a vertical direction and said two semiconductor device packages are loaded and unloaded via vertical movement of said transfer rod.

13. The apparatus according to claim 12, wherein said loading tool and said removal tool further comprise a rotation cylinder coupled to an upper end portion of said transfer rod.

14. The apparatus according to claim 12, wherein said connection rod is fastened to said transfer rod and is fitted into said rod screw so that said connection rod can be vertically moved along said rod screw by rotation of said rod screw.

15. The apparatus according to claim 12, further comprising:
a ready position having receiving spaces for receiving two of said semiconductor device packages from said feed tube wherein said feeder feeds said two semiconductor device packages to said ready position.

16. The apparatus according to claim 12, wherein each of said separators, for feeding the semiconductor device packages from said single transfer rail to said first and second transfer rails comprise a body having a left cavity and a right cavity for receiving said two semiconductor device packages, said body moving in a horizontal direction into alignment with each of said first and second transfer rails in turn, such that when, in a first state, said left cavity is aligned with said first transfer rail and said right cavity is aligned with said single transfer rail, there through one of said semiconductor device packages in said single transfer rail passes out of said single transfer rail and into said night cavity while one of said two semiconductor device packages in said left cavity passes out of the left cavity and into said first transfer rail, and when, in a second state, said left cavity is aligned with said single transfer rail and said right cavity is aligned with said second transfer rail, there through one of said semiconductor device packages in said single transfer rail passes out of said single transfer rail and into said left cavity while one of said two semiconductor device packages in said right cavity passes out of the right cavity and into said second transfer rail.

17. The apparatus according to claim 16, wherein said left and right cavities are linear.

18. The apparatus according to claim 12, said extension tool further comprising a timing belt, said extension tool being movable in a horizontal direction along said timing belt.

19. The apparatus according to claim 12, said loading tool further comprising a timing belt, said loading tool being movable in a horizontal direction along said timing belt.

20. The apparatus according to claim 12, wherein said DC test contact tool, said insertion tool and said removal tool are spaced apart from each other and fastened to a connection block, and wherein said connection block is provided with a servo motor so that said connection block can be moved in a horizontal direction.

21. The apparatus according to claim 12, said two side pushers operate simultaneously in a same direction.

22. The apparatus according to claim 1, wherein said first and second cavities are linear.

* * * * *